US007093229B2

(12) United States Patent  
Pang et al.

(10) Patent No.: US 7,093,229 B2  
(45) Date of Patent: Aug. 15, 2006

(54) SYSTEM AND METHOD FOR PROVIDING DEFECT PRINTABILITY ANALYSIS OF PHOTOLITHOGRAPHIC MASKS WITH JOB-BASED AUTOMATION

(75) Inventors: Linyong Pang, Castro Valley, CA (US); Fang-Cheng Chang, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 235 days.

(21) Appl. No.: 10/618,816

(22) Filed: Jul. 11, 2003

(65) Prior Publication Data

US 2004/0015808 A1    Jan. 22, 2004

Related U.S. Application Data

(60) Continuation-in-part of application No. 10/372,066, filed on Feb. 20, 2003, which is a division of application No. 09/544,798, filed on Apr. 7, 2000, now Pat. No. 6,578,188, which is a continuation-in-part of application No. 09/130,996, filed on Aug. 7, 1998, now Pat. No. 6,757,645.

(60) Provisional application No. 60/059,306, filed on Sep. 17, 1997.

(51) Int. Cl.
*G06F 17/50* (2006.01)

(52) U.S. Cl. .................................. 716/21
(58) Field of Classification Search .............. 716/4–6, 716/19–21; 703/13; 702/59, 81; 430/5; 382/144, 145, 149

See application file for complete search history.

(56) References Cited

U.S. PATENT DOCUMENTS

| | | | |
|---|---|---|---|
| 4,812,962 A | 3/1989 | Witt | 364/490 |
| 5,051,598 A | 9/1991 | Ashton et al. | 250/492.2 |
| 5,182,718 A | 1/1993 | Harafuji et al. | 364/490 |
| 5,241,185 A | 8/1993 | Meiri et al. | 250/492.2 |
| 5,242,770 A | 9/1993 | Chen et al. | 430/5 |
| 5,256,505 A | 10/1993 | Chen et al. | 430/5 |
| 5,282,140 A | 1/1994 | Tazawa et al. | 364/468 |
| 5,316,878 A | 5/1994 | Saito et al. | 430/5 |

(Continued)

FOREIGN PATENT DOCUMENTS

EP    0 698 821 A1    2/1996

(Continued)

OTHER PUBLICATIONS

Avant! . . . Solutions & Products, Taurus-Lithography, Avant! Corporation, Feb. 22, 2001, pp. 1-3.*

(Continued)

*Primary Examiner*—Vuthe Siek  
(74) *Attorney, Agent, or Firm*—Bever, Hoffman & Harms, LLP; Jeanette S. Harms

(57) ABSTRACT

Serious defects on a mask can compromise the functionality of the integrated circuits formed on the wafer. Nuisance defects, which do not affect the functionality, waste expensive resources. A defect analysis tool with job-based automation can accurately and efficiently determine defect printability. This tool can run a job, using a mask file, to simulate the wafer exposure that the mask would provide under a given set of parameters. These parameters can relate to the mask itself, the inspection system used to create the mask file, and the stepper that can be used to expose the mask. The processes performed during the job can be done uniformly for defects on the mask. This uniformity allows the tool to efficiently run multiple jobs. The results of the job can be presented using different levels of detail to facilitate user review.

42 Claims, 11 Drawing Sheets

U.S. PATENT DOCUMENTS

| | | | |
|---|---|---|---|
| 5,326,659 A | 7/1994 | Liu et al. | 430/5 |
| 5,340,700 A | 8/1994 | Chen et al. | 430/312 |
| 5,424,154 A | 6/1995 | Borodovsky | 430/5 |
| 5,432,714 A | 7/1995 | Chung et al. | 364/525 |
| 5,447,810 A | 9/1995 | Chen et al. | 430/5 |
| 5,504,335 A | 4/1996 | Maarschalkerweerd | |
| 5,532,090 A | 7/1996 | Borodovsky | 430/5 |
| 5,533,148 A | 7/1996 | Sayah et al. | 382/240 |
| 5,538,815 A | 7/1996 | Oi et al. | 430/5 |
| 5,553,273 A | 9/1996 | Liebmann | 395/500 |
| 5,553,274 A | 9/1996 | Liebmann | 395/500 |
| 5,572,598 A | 11/1996 | Wihl et al. | 382/144 |
| 5,631,110 A | 5/1997 | Shioiri et al. | 430/5 |
| 5,657,235 A | 8/1997 | Liebmann et al. | 364/474.24 |
| 5,663,017 A | 9/1997 | Schinella et al. | 430/5 |
| 5,663,893 A | 9/1997 | Wampler et al. | 364/491 |
| 5,702,848 A | 12/1997 | Spence | 430/5 |
| 5,705,301 A | 1/1998 | Garza et al. | 430/5 |
| 5,707,765 A | 1/1998 | Chen | 430/5 |
| 5,740,068 A | 4/1998 | Liebmann et al. | 364/489 |
| 5,786,112 A * | 7/1998 | Okamoto et al. | 430/5 |
| 5,795,688 A | 8/1998 | Burdorf et al. | 430/30 |
| 5,801,954 A | 9/1998 | Le et al. | 364/488 |
| 5,804,340 A | 9/1998 | Garza et al. | 430/5 |
| 5,807,649 A | 9/1998 | Liebmann et al. | |
| 5,815,685 A | 9/1998 | Kamon | 395/500 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,849,440 A | 12/1998 | Lucase et al. | 430/5 |
| 5,862,058 A | 1/1999 | Samuels et al. | 364/491 |
| 5,863,682 A | 1/1999 | Abe et al. | 430/30 |
| 5,879,844 A | 3/1999 | Yamamoto et al. | 430/30 |
| 5,900,338 A | 5/1999 | Garza et al. | 430/5 |
| 5,923,566 A | 7/1999 | Galan et al. | 364/489 |
| 5,972,541 A | 10/1999 | Sugasawara et al. | 430/5 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,016,357 A | 1/2000 | Neary et al. | 382/144 |
| 6,023,565 A | 2/2000 | Lawman et al. | |
| 6,076,465 A | 6/2000 | Vacca et al. | 101/481 |
| 6,077,310 A | 6/2000 | Yamamoto et al. | 716/19 |
| 6,078,738 A | 6/2000 | Garza et al. | 395/500.22 |
| 6,081,658 A | 6/2000 | Rieger et al. | 395/500.22 |
| 6,081,659 A | 6/2000 | Garza et al. | 395/500.22 |
| 6,091,845 A | 7/2000 | Pierrat et al. | |
| 6,130,750 A | 10/2000 | Ausschnitt et al. | 356/401 |
| 6,171,731 B1 | 1/2001 | Medvedeva et al. | 430/5 |
| 6,185,727 B1 | 2/2001 | Liebmann | 716/19 |
| 6,272,236 B1 | 8/2001 | Pierrat et al. | |
| 6,322,935 B1 | 11/2001 | Smith | |
| 6,370,679 B1 | 4/2002 | Chang et al. | |
| 6,436,590 B1 | 8/2002 | Wang et al. | |
| 6,498,685 B1 | 12/2002 | Johnson | |
| 6,513,151 B1 * | 1/2003 | Erhardt et al. | 716/21 |
| 6,526,164 B1 * | 2/2003 | Mansfield et al. | 382/144 |
| 6,614,924 B1 * | 9/2003 | Aghajan | 382/149 |
| 6,632,322 B1 * | 10/2003 | Gottscho et al. | 156/345.33 |
| 6,691,052 B1 * | 2/2004 | Maurer | 702/81 |
| 6,757,645 B1 * | 6/2004 | Chang et al. | 703/13 |
| 6,802,045 B1 * | 10/2004 | Sonderman et al. | 716/2 |
| 2002/0019729 A1 | 2/2002 | Chang et al. | 703/6 |
| 2002/0035461 A1 | 3/2002 | Chang et al. | 703/13 |
| 2003/0161525 A1* | 8/2003 | Bruce et al. | 382/149 |
| 2004/0133369 A1* | 7/2004 | Pack et al. | 702/59 |

FOREIGN PATENT DOCUMENTS

| | | |
|---|---|---|
| WO | WO 97/13370 A1 | 4/1997 |
| WO | WO 97/38381 A1 | 10/1997 |
| WO | WO 98/20327 A1 | 5/1998 |
| WO | WO 98/45685 A1 | 10/1998 |
| WO | WO 99/14706 A2 | 3/1999 |
| WO | WO 99/14706 A3 | 3/1999 |
| WO | WO 00/36525 A2 | 6/2000 |
| WO | WO 00/67074 A1 | 11/2000 |
| WO | WO 00/67075 A1 | 11/2000 |
| WO | WO 00/67076 A1 | 11/2000 |

OTHER PUBLICATIONS http://www.semantech.org/resources/litho/meetings/ mask/20010711/O_DATA-FORMAT-BO.pdf, "Mask Data Format Standardization," Jul. 11, 2001, pp. 1-11.*

Lithas, "Lithas: Optical Proximity Correction Software" (2 pages).

Microunity, "OPC Technology & Product Description", MicroUnity Systems Engineering, Inc., pp. 1-5.

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity-Corrected Patterns", Precim Company, Portland, Oregon (10 pages).

Rieger, M., et al., "Using Behavior Modeling for Proximity Correction", Precim Company, Portland, Oregon (6 pages).

Spence, C., et al., "Detection of 60(degree) Phase Defects on Alternating PSMs", Advanced Micro Devices, KLA-Tencor, DuPont RTC (2 pages).

Stirniman, J., et al., "Spatial Filter Models to Describe IC Lithographic Behavior", Precim Corporation, Portland, Oregon (10 pages).

Sugawara, M., et al., "Defect Printability Study of Attenuated Phase-Shifting Masks for Specifying Inspection Sensitivity", Sony Corporation, Kanagawa, Japan (16 pages).

Cobb, et al., "Fast Sparse Aerial Image Calculation for OPC", SPIE, vol. 2621, pp. 534-544, Sep. 20-22, 1995.

Ogawa, K., et al., "Phase Defect Inspection by Differential Interference", Lasertec Corporation (12 pages).

Kang, D., et al., "Effects of Mask Bias on t he Mask Error Enhancement Factor (MEEF) of Contact Holes" (11 pages).

Socha, R., et al., "Printability of Phase-Shift Defects Using a Perturbational Model", Univ. of California Berkeley, Sematech (11 pages).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase-Shifting Masks", Panoramic Technology Inc. (13 pages).

Semmier, A., et al., "Application of 3D EMF Simulation for Development and Optimization of Alternating Phase Shifting Mask", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM-Technology", Fraunhofer Institute of Integrated Circuits (11 pages).

Fiekowsky, P., "The End of Thresholds: Subwavelength Optical Linewidth Measurement Using the Flux-Area Technique", Automated Visual Inspection (6 pages).

Nguyen, K., et al., "Printability of Substrate and Absorber Defects on Extreme Ultraviolet Lithographic Masks", Sandia National Labs, AT&T Bell Labs (18 pages).

Neureuther, A., et al., "Modeling Defect-Feature Interactions in the Presence of Aberrations", University of California Berkeley (10 pages).

Casey, Jr., J.D., et al., "Chemically Enhanced FIB Repair of Opaque Defects on Molybdenum Silicide Photomasks", SPIE, vol. 3236, pp. 487-497 (1997).

Trans Vector, "Now Better Quality Photomasks", Trans Vector Technologies, Inc., Camarillo, California (4 pages).

Mathur, B.P., et al., "Quantitative Evaluation of Shape of Image on Photoresist of Square Apertures", IEEE, Transactions On Electron Devices, vol. 35, No. 3, pp. 294-297, Mar. 1988.

Jinbo, H., et al., "0.2um or Less i-Line Lithography by Phase-Shifting-Mask Technology", IEEE, pp. 33.3.1-33.3.4 (1990).

Neureuther, A., "Modeling Phase Shifting Masks", SPIE, 10th Annual Symposium On Microlithography, vol. 1496, pp. 80-85 (1990).

Henke, W., et al., "A Study of Reticle Defects Imaged Into Three-Dimensional Developed Profiles of Positive Photoresist Using the Solid Lithography Simulator", Microelectronics Eng., vol. 14, pp. 283-297 (1991).

Jinbo, H., et al., "Improvement of Phase-Shifter Edge Line Mask Method", Japanese Journal Of Applied Physics, vol. 30, No. 11B, pp. 2998-3003, Nov. 1991.

Kimura, T., et al., "Subhalf-Micron Gate GaAs Mesfet Process Using Phase-Shifting-Mask Technology", IEEE, GaAs IC Symposium, pp. 281-284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Fu, C.C., et al., "Enhancement of Lithographic Patterns by Using Serif Features", IEEE, Transactions On Electron Devices, vol. 38, No. 12, pp. 2599-2603, Dec. 1991.

Watanabe, H., et al., "Detection and Printability of Shifter Defects in Phase-Shifting Masks", Japanese Journal of Applied Physics, vol. 30, No. 11B, pp. 3016-3020, Nov. 1991.

Ham, Y.M., et al., "Dependence of Defects in Optical Lithography", Jpn. J. Appl. Phys., vol. 31, pp. 4137-4142 (1992).

Jinbo, H., et al., "Application of Blind Method to Phase-Shifting Lithography", IEEE, 1992 Symposium On VLSI Technology Digest Of Technical Papers, pp. 112-113 (1992).

Ohtsuka, H., et al., "Phase Defect Repair Method for Alternating Phase Shift Masks Conjugate Twin-Shifter Method", Jpn. J. Appl. Phys., vol. 31, pp. 4143-4149 (1992).

Watanabe, H., et al., "Detection and Printability of Shifter Defects in Phase-Shifting Masks II Defocus Characteristics", Jpn. J. Appl. Phys., vol. 31, pp. 4155-4160 (1992).

Crisalle, O., et al., "A Comparison of the Optical Projection Lithography Simulators in SAMPLE and PROLITH", IEEE, Transactions On Semiconductor Manufacturing, vol. 5, No. 1, pp. 14-26, Feb. 1992.

Rothschild, M., et al., "Photolithography at 193nm", J. Vac. Sci. Technol. B, vol. 10, No. 6, pp. 2989-2996, Nov./Dec. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229-235 (1992).

Lin, B.J., et al., "Single-Level Electric Testsites for Phase-Shifting Masks", SPIE, vol. 1673, pp. 221-228, Mar. 9-11, 1992.

Brunner, T., "Rim Phase-Shift Mask Combined with Off-Axis Illumination: A Path to 0.5(lampda)/Numerical Aperture Geometries", Optical Engineering, vol. 32, No. 10, pp. 2337-2343, Oct. 1993.

Nistler, J., et al., "Phase Shift Mask Defect Printability Analysis", Proceedings Of The Microlithography Seminar INTERFACE '93, OCG Microelectronic Materials, Inc., pp. 11-28 (1993).

Rieger, M., et al., "System for Lithography Proximity Compensation", Precim Company, Portland, Oregon, Sep. 1993 (28 pages).

Wiley, J., et al., "Device Yield and Reliability by Specification of Mask Defects", Solid State Technology, vol. 36, No. 7, pp. 65-66, 70, 72, 74, 77, Jul. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Nistler, J., et al., "Large Area Optical Design Rule Checker for Logic PSM Application", SPIE, Photomask And X-Ray Mask Technology, vol. 2254, pp. 78-92 (1994).

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Spence, C., et al., "Automated Determination of CAD Layout Failures Through Focus: Experiment and Simulation", SPIE, vol. 2197, pp. 302-313 (1994).

Stirniman, J., et al., "Fast Proximity Correction with Zone Sampling", SPIE, vol. 2197, pp. 294-301 (1994).

Stirniman, J., et al., "Optimizing Proximity Correction for Wafer Fabrication Process", SPIE, Photomask Technology And Management, vol. 2322, pp. 239-246 (1994).

Stirniman, J., et al., "Wafer Proximity Correction and Its Impact on Mask-Making", Bacus News, vol. 10, Issue 1, pp. 1, 3-7, 10-12, Jan. 1994.

Qian, Q.D., et al., "A New Scalar Planewave Model for High NA Lithography Simulations", IEEE, pp. 45-48 (1994).

Barouch, E., et al., "Optimask: An OPC Algorithm for Chrome and Phase-Shift Mask Design", SPIE, Vo. 2440, pp. 192-206, Feb. 1995.

Karklin, L., "A Comprehensive Simulation Study of the Photomask Defects Printability", SPIE, vol. 2621, pp. 490-504 (1995).

Wiley, J., et al., "The Effect of Off-Axis Illumination on the Printability of Opaque and Transparent Reticle Defects", SPIE, vol. 2512, pp. 432-440 (1995).

Reynolds, J., "Elusive Mask Defects: Reflectivity Variations", Solid State Technology, pp. 75-76, Mar. 1995.

Brunner, T., et al., "Approximate Models for Resist Processing Effects", SPIE, vol. 2726, pp. 198-207, Mar. 1996.

Rieger, M., et al., "Customizing Proximity Correction for Process-Specific Objectives", SPIE, vol. 2726, pp. 651-659 (1996).

Yen, A., et al., "Characterization and Correction of Optical Proximity Effects in Deep-Ultraviolet Lithography Using Behavior Modeling", J. Vac. Sci. Technol. B, vol. 14, No. 6, pp. 4175-4178, Nov./Dec. 1996.

Kusunose, H., et al., "Direct Phase-Shift Measurement with Transmitted Deep-UV Illumination", SPIE, vol. 2793, pp. 251-260 (1996).

Chang, K., et al., "Accurate Modeling of Deep Submicron Interconnect Technology", TMA Times, vol. IX, No. 3 (1997).

Gans, F., et al., "Printability and Repair Techniques for DUV Photomasks", SPIE, Proceedings Of The 17th Annual Symposium On Photomask Technology And Management, vol. 3236, pp. 136-141 (1997).

Ibsen, K., et al., "Clear Field Reticle Defect Diposition for Advanced Sub-Half Micron Lithography", SPIE, Proceedings Of The 17th Annual Symposium On Photomask Technology And Management, vol. 3236, pp. 124-135 (1997).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243-249 (1997).

Morimoto, H., et al., "Next Generation Mask Strategy—Technologies are Ready for Mass Production of 256MDRAM?", SPIE, vol. 3236, pp. 188-189 (1997).

Park, C., et al., "An Automatic Gate CD Control for a Full Chip Scale SRAM Device", SPIE, vol. 3236, pp. 350-357 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62-74, Feb. 1997.

Roman, B., et al., "Implications of Device Processing on Photomask CD Requirements", SPIE, vol. 3236 (1997) (Abstract Only).

Vacca, A., et al., "100nm Defect Detection Using a Dynamically Programmable Image Processing Algorithm", SPIE, vol. 3236 (1997) (Abstract Only).

Ausschnitt, C., et al., "Advanced DUV Photolithography in a Pilot Line Environment", IBM J. Res. Develop., vol. 41, No. 1/2, pp. 21-37, Jan./Mar. 1997.

Brunner, T., "Impact of Lens Aberrations on Optical Lithography", IBM J. Res. Develop., vol. 41, No. 1/2, pp. 57-67, Jan./Mar. 1997.

Hawryluk, A., et al., "EUV Lithography", Miicrolithography World, pp. 17-18 & 20-21, Summer 1997.

Holmes, S., et al., "Manufacturing with DUV Lithography", IBM J. Res. Develop., vol. 41, No. 1/2, pp. 7-19, Jan./Mar. 1997.

Rothschild, M., et al., "Lithography at a Wavelength of 193nm", IBM J. Res. Develop., vol. 41, No. 1/2, pp. 49-55, Jan./Mar. 1997.

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Shoenmaker, W., et al., "Theory and Implementation of a New Interpolation Method Based on Random Sampling", IMEC Technology Paper, pp. 1-35, Jan. 31, 1997.

Kubota, H., et al., "A Fast Method of Simulating Resist Pattern Contours Based on Mean Inhibitor Concentration", Jpn. J. Appl. Phys., vol. 37, pp. 5815-5820 (1998).

Vacca, A., et al., "100nm Defect Detection Using an Existing Image Acquisition System", SPIE, vol. 3236, pp. 208-221 (1998).

Fukuda, H., et al., "Determination of High-Order Lens Aberration Using Phase/Amplitude Linear Algebra", J. Vac. Sci. Technol. B, vol. 17, No. 6, pp. 3318-3321, Nov./Dec. 1999.

Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295, Nov./Dec. 1999.

Balasinski, A., et al., "A Novel Approach to Simulate the Effect of Optical Proximity on MOSFET Parametric Yield", IEEE, pp. 37.6.1-37.6.4 (1999).

Balasinski, A., et al., "Comparison of Mask Writing Tools and Mask Simulations for 0.16um Devices", IEEE, SEMI Advanced Semiconductor Manufacturing Conference, pp. 372-377 (1999).

* cited by examiner

Virtual Stepper System

Settings
- Mask Setting
- Stepper Setting
- Inspection System

Job
- Run

Review
- Level 1
- Level 2
- Level 3

Administration
- Group Setup
- Account Setup
- Data Backup
- Data Restore
- Job Server
- Status Check

Maintenance

Security logoff

_200_

Name [ AP Mask ]

Type [ ATT-PSM ▼ ]  _201_

Phase (degree) [ 180.0 ]

Transmision (%) [ 6.0 ]  _202_

[ Add ]

| | Mask Type | Mask Name | Phase | Transmission | |
|---|---|---|---|---|---|
| ☐ | Binary | B Mask | | | Edit |
| ☐ | ATT-PSM | AP Mask | 180.0 | 6.0 | Edit |

[ Delete ]  [ Delete All ]  [ Update ]

Figure 2

Virtual Stepper System

Settings
- Mask Setting
- Stepper Setting
- Inspection System

Job
- Run

Review
- Level 1
- Level 2
- Level 3

Administration
- Group Setup
- Account Setup
- Data Backup
- Data Restore
- Job Server
- Status Check

Maintenance

Security logoff

300

| Name | Stepper 1 |
| Wavelength | 248 |
| NA | 0.57 |
| Reduction | 4.0 |
| Defocus | Single ▶ |
| Illumination | Angular ▶ |

Add

301

302

Advanced

| Stepper Name | Wavelength | NA | Reduction | Illumination | |
|---|---|---|---|---|---|
| ☐ Stepper 1 | 248 | 0.57 | 4.0 | Angular | Edit |
| ☐ Stepper 2 | 365 | 0.65 | 2.5 | Circular | Edit |

Delete    Delete All    Update

Figure 3

Virtual Stepper System logoff

Settings
Mask Setting
Stepper Setting
Inspection System

Job
Run

Review
Level 1
Level 2
Level 3

Administration
Group Setup
Account Setup
Data Backup
Data Restore
Job Server
Status Check Maintenance

Security

500

Start Date [2003-2-3 ▼]  End Date [2003-2-26 ▼]

501

Go

502

Maintenance History

| Record ID | MaskID | SerialNo | Creation Time |
|---|---|---|---|
| ☐ 17 | skull | squad | 02-26-03:01.36.48 |
| ☐ 18 | uuu2 | 111 | 02-25-03:04.13.27 |

Delete  Select All  [Full ▼]  [Import Results]

Virtual Stepper System 600

Settings
- Mask Setting
- Stepper Setting
- Inspection System

Job
Run

Review
- Level 1
- Level 2
- Level 3

Administration
- Group Setup
- Account Setup
- Data Backup
- Data Restore
- Job Server
- Status Check

Maintenance

Security

Threshold Setting

Tolerance  -10 % -  10 %     605

◉ Use Auto Thresholding     606

◉ Wafer CD = (Mask CD/Reduction) + 10  Bias (nm)
○ Mask CD
○ Wafer CD

○ Use Manual Thresholding     607

Nominal Threshold
Threshold

Process Window Range     608

Exposure    -5 % - 5 %

Defocus (nm)  0 - 0 logoff

Figure 6B

Virtual Stepper System

700 logoff

Settings
Mask Setting
Stepper Setting
Inspection
System

Job
Run

Review
Level 1
Level 2
Level 3

Administration
Group Setup
Account Setup
Data Backup
Data Restore
Job Server
Status Check

Maintenance

Security

Inspection System: [uv305 ▶]

Created Between: [02-26-03 ▶]

To: [02-27-03 ▶]

Lot Name: [All ▶]

[Search]

SYSTEM AND METHOD FOR PROVIDING DEFECT PRINTABILITY ANALYSIS OF PHOTOLITHOGRAPHIC MASKS WITH JOB-BASED AUTOMATION

RELATED APPLICATIONS

This application is a continuation-in-part of U.S. patent application Ser. No. 10/372,066, entitled "User Interface For A Network-Based Mask Defect Printabilty Analysis System", filed Feb. 20, 2003, which is divisional of U.S. patent application Ser. No. 09/544,798 now U.S. Pat No. 6,578, 188, entitled "Method and Apparatus For A Network-Based Mask Defect Printability Analysis System", filed Apr. 7, 2000, which is a continuation-in-part of U.S. patent application Ser. No. 09/130,996 entitled, "Visual Inspection and Verification System", filed Aug. 7, 1998 now U.S. Pat No. 6,757,645, which in turn relates to U.S. Provisional Patent Application Ser. No. 60/059,306, entitled "Mask Verification Correction and Design Rule Checking", filed Sep. 17, 1997, all of which are incorporated by reference herein.

BACKGROUND OF THE INVENTION

1. Field of the Invention

This invention relates to the field of integrated circuit manufacturing. In particular, the invention relates to a method and a system for analyzing defects on binary intensity masks, phase-shifting masks, and next generation lithography (NGL) masks used in the manufacture of integrated circuits with job-based automation.

2. Description of Related Art

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, i.e. a layout. Again, computer aided design (CAD) tools assist layout designers in the task of translating the discrete circuit elements into shapes, which will embody the devices themselves in the completed IC. These shapes make up the individual components of the circuit, such as gate electrodes, field oxidation regions, diffusion regions, metal interconnections, and so on.

Once the layout of the circuit has been created, the next step to manufacturing the integrated circuit is to transfer the layout onto a semiconductor substrate. One way to do this is to use the process of photolithography in which the layout is first transferred onto a physical template, which is in turn used to optically project the layout onto a wafer.

In transferring the layout to the physical template, a mask (for example, a quartz plate coated with chrome) is generally created for each layer of the integrated circuit design. This is done by inputting the data representing the layout design for that layer into a device, such as an electron beam machine, which writes the integrated circuit layout pattern into the mask material. In less complicated and dense integrated circuits, each mask comprises the geometric shapes that represent the desired circuit pattern for its corresponding layer. In more complicated and dense circuits in which the size of the circuit features approach the optical limits of the lithography process, the masks may also comprise optical proximity correction (OPC) features, such as serifs, hammerheads, bias and assist bars. In other advanced circuit designs, phase-shifting masks may be used to circumvent certain basic optical limitations of the process by enhancing the contrast of the optical lithography process.

These masks are then used to optically project the layout onto a silicon wafer coated with photoresist material. For each layer of the design, a light (visible/non-visible radiation) is shone on the mask corresponding to that layer. This light passes through the clear regions of the mask, whose image exposes the underlying photoresist layer, and is blocked by the opaque regions of the mask, thereby leaving that underlying portion of the photoresist layer unexposed. (Note that the preceding example is predicated on current generation DUV lithography. In next generation lithography, e.g. x-ray lithography, the mask may operate slightly differently.) The exposed photoresist layer is then developed, typically through chemical removal of the exposed/non-exposed regions of the photoresist layer. The result is a semiconductor wafer coated with a photoresist layer exhibiting a desired pattern, which defines the geometries, features, lines and shapes of that layer. This process is then repeated for each layer of the design.

As integrated circuit designs become more complicated, it becomes increasingly important that the masks used in photolithography are accurate representations of the original design layout. Unfortunately, the electron beam and other machines used to manufacture these masks are not error-free. Thus, in the typical manufacturing process, some mask defects do occur outside the controlled process.

A defect on a mask is anything that is different from the design database and is deemed intolerable by an inspection tool or an inspection engineer. A mask can comprise a plurality of opaque areas (typically made of chrome) and a plurality of clear areas (typically made of quartz). In a bright field mask, the background is clear and the circuit pattern is defined by opaque areas. In a dark field mask, the background is opaque and the circuit pattern is defined by clear areas. Common mask defects that occur during a bright field mask manufacturing process include, for example, an isolated opaque spot defect in a clear area, an isolated clear pinhole defect in an opaque area, an edge intrusion defect in an opaque area, an edge protrusion defect in a clear area, a geometry break defect in an opaque area, and a geometry bridge defect in a clear area. Similar type defects can occur in a dark field mask manufacturing process. Defects may also occur in the OPC features provided on the chip.

After designing an integrated circuit and creating a data file, the mask design data is provided to a device such as an electron beam or laser writing machine and a mask is manufactured. The mask is then inspected for defects. In this inspection, the surface of the mask can be scanned with a high resolution microscope (e.g. optical, scanning electron, focus ion beam, atomic force, and near-field optical microscopes), which captures images of the mask.

These mask images can then be observed off-line by an engineer or on-line by a mask fabrication worker to identify defects on the physical mask. Then, a decision is made whether the inspected mask is good enough for use in the photolithography process. This decision can be made off-line by a skilled inspection engineer or on-line by a fabrication worker, possibly with the aid of inspection software. If there are no defects, or defects are discovered but determined to be within tolerances set by the manufacturer or user, then the mask passes inspection and can be used to expose a wafer. If defects are discovered that fall outside tolerances, then the mask fails inspection and a decision is made as to whether the mask can be cleaned and/or repaired to correct the defects, or whether the defects are so severe that a new mask must be manufactured. This process is continued until a manufactured mask passes inspection.

In one embodiment, the mask can be further inspected to ensure that the mask will produce the desired image on a photoresist after a wafer is exposed to light through the mask. Frequently, this inspection includes exposing and processing a wafer using the inspected mask. Then, a decision is made as to whether there are any defects on the processed wafer and whether the defects fall within tolerances. If discovered defects are substantial, then, as before, a decision is made whether the defects can be repaired or whether a new mask must be produced. This process is continued until a mask is manufactured that will produce the desired wafer patterns and that will pass the wafer level inspection, thereby ending inspection. This mask is then used in the photolithography process to expose the corresponding layer in the overall manufacturing process.

The goal of defect inspection is to correctly identify a defect to avoid a failed wafer processing. However, not all mask defects are important with respect to the desired result, i.e. an accurate representation of the original design layout on the photoresist material or etched into silicon. Specifically, not all mask defects will "print." Loosely speaking, the printability of a defect is how a defect would impact the outcome of a given photolithography and/or wafer processing approach, including etching, implantation, etc. Because the printability of a defect is mainly associated with the stepper exposure conditions, a defect can be "not printable" for a particular set of stepper exposure conditions and "printable" under a different set of stepper exposure conditions. These conditions for optical photolithography can include, for example, defect size, wavelength, numerical aperture, coherence factor, illumination mode, exposure time, exposure focus/defocus, defect location, surrounding features, and the reflection/transmission characteristics of the defect.

Accordingly, in any mask inspection system, the important decision to be made is whether a given defect will "print" on the underlying photoresist in a photolithography process under specified conditions. If a mask defect does not print or have other effects on the photolithography process (such as unacceptably narrowing the process window), then the mask with the defect can still be used to provide acceptable results. Therefore, one can avoid the expense in time and money of repairing and/or replacing masks whose defects do not print. What is desired then, is a method and system for quickly and accurately analyzing defects on the masks used in the photolithography process.

SUMMARY OF THE INVENTION

Providing an accurate pattern transfer from a layout to a wafer is the ultimate goal of design companies, mask shops, and wafer fabrication facilities. Inspecting a mask for defects is an integral step in ensuring this accurate pattern transfer. Specifically, if a mask defect is significant, then the functionality of the integrated circuits (ICs) formed on the wafer could be compromised. In this case, the defect on the mask must be repaired (if repairable) or the mask must be remanufactured. On the other hand, if the mask defect is deemed to be a nuisance defect that does not affect IC functionality, then the defect does not need to be repaired, thereby saving both personnel and equipment resources for other tasks.

In accordance with one feature of the invention, a defect analysis tool with job automation can advantageously determine defect printability. Specifically, this defect analysis tool can use a captured image of a mask to simulate the wafer exposure that the mask would provide under a given set of stepper conditions. The captured image of the file can be provided in a mask file having a standard mask format file (MFF). In another embodiment, non-MFF mask data can be converted into an MFF file.

A user can specify a job to be run using the mask file. Of importance, the job defines parameters relating to processes to provide the defect analysis. The parameters can include settings relating to the mask, such as mask type, phase(s) of the mask, and/or transmission of the mask. The parameters can further include settings relating to an inspection system that provided information for the mask file. These inspection system settings could include an inspection system vendor, an inspection system model, and/or parameters used in carrying out the inspection. The parameters can further include settings relating to a stepper that can be used in exposing the mask during photolithography. These stepper settings could include wavelength, numerical aperture, reduction, defocus, and/or illumination. Thus, the wafer simulation can be computed to take into account any number of parameters associated with the mask, inspection system, and stepper, thereby increasing the accuracy of the printability determination.

Of importance, the processes to provide defect analysis can be performed uniformly for defects on the mask. This uniformity, without need for additional user input, allows the defect analysis tool to efficiently run multiple jobs. For example, in one embodiment, a job manager can allow multiple jobs to be run in parallel. The job manager can also schedule multiple computation resources to run one or more jobs.

In accordance with another feature of the invention, the results can be presented using multiple levels for user review. For example, a first review level can include an overall summary of simulations performed on the defects and/or defect scoring. A second review level can include a defect map of the defects on the mask. In one embodiment, the defect map is color-coded, wherein each color represents a predetermined defect severity. In one embodiment, a flashing light can indicate a high defect severity. A third review level, which is the most detailed level of review, can include aerial images of each defect with predicted wafer contours and a corresponding reference image of that defect.

The user can perform the job specification and job results review using a graphic user interface. In one embodiment, a web browser can facilitate remote user access to the defect analysis tool.

In accordance with yet another feature of the invention, a status for each defect can be entered. This status can be based on a user's review of the results of the job. In one embodiment, a history of statuses for each defect can also be provided. These statuses can be based on users' reviews of the results of the job. Based on the statuses of defects on the mask, a user can make a well-informed and timely decision regarding whether a mask can be used as is, should be repaired, or must be re-manufactured.

In accordance with embodiments of the invention, both a system and a computer program product can be provided for implementing this defect analysis functionality.

In accordance with another feature of the invention, a graphic user interface (GUI) can be provided for defect printability analysis on a photolithographic mask. The GUI can have a main menu bar that includes a plurality of setting links, a job run link, and a plurality of review links.

The plurality of setting links can include a mask setting link, a stepper setting link, and an inspection system link. The mask setting link is associated with a mask parameter screen that allows a user to input parameters regarding the photolithographic mask. Such parameters could include a mask name, a mask type, phase values, and transmittance values for certain semi-transparent areas on the mask. The stepper setting link is associated with a stepper parameter screen that allows a user to input parameters regarding a stepper usable for exposing the photolithographic mask. Such parameters could include a stepper name, a stepper wavelength, a stepper numerical aperture, a stepper reduction, a stepper defocus and range of defocus, and a stepper illumination. The inspection system link is associated with an inspection system parameter screen that allows a user to input parameters regarding an inspection system used to inspect the photolithographic mask. Such parameters could include an inspection system name, an inspection system vendor, and an inspection system model.

The job run link is associated with a job parameter screen that allows a user to input parameters regarding a job to provide the defect printability analysis. Such parameters could include a job type and a reuse old recipe designation.

The plurality of review links can include three review links. A first level review link can be associated with a first screen that allows a user to search for the defect printability analysis. The first screen can include parameters for an inspection system used to inspect the photolithographic mask and creation dates of the defect printability analysis.

A second level review link can be associated with a second screen that allows a user to view defect printability analysis results for the photolithographic mask. The second screen can include a summary representation of defect severity.

A third level review link can be associated with a third screen that allows a user to view defect printability analysis results for each defect on the photolithographic mask. The third screen can include a defect image of each defect, a reference image associated with that defect image, and simulated results associated with those defect and reference images. The third screen can further include a status parameter for each reviewed defect.

BRIEF DESCRIPTION OF THE DRAWINGS

FIG. 2 illustrates an exemplary mask setting page that can capture and organize information about a mask the user desires to analyze.

FIG. 3 illustrates an exemplary stepper setting page that can capture and organize information about a potential stepper that can be used in defect analysis.

FIG. 5 illustrates an exemplary maintenance page that can enable the user to prune the database of unwanted simulation data and to compress mask files, stepper settings, and data results for transfer to another database.

FIGS. 6A and 6B illustrate an exemplary run page that allows a user to run a defect analysis job.

FIG. 7 illustrates an exemplary first level review page that allows a user to search for a completed defect analysis job.

FIG. 8 illustrates an exemplary second level review page that allows a user to filter defects for detailed review.

DETAILED DESCRIPTION OF THE DRAWINGS

Photolithography is a process whose input is a mask and whose output is a printed pattern on a wafer. The printed pattern is what design companies, mask shops, and wafer fabrication facilities really care about. One way to inspect this printed pattern is to perform an actual wafer exposure. However, this method incurs significant costs in time and money.

In accordance with one feature of the invention, a defect analysis tool with job-based automation and web browser graphic user interface can advantageously determine defect printability without the need for the expensive steps of actually exposing a wafer. Specifically, this job-based defect analysis tool can use a captured image of a mask (e.g. an image from a high resolution optical microscope or a scanning electron microscope) to simulate the wafer exposure that the mask would provide under a given set of stepper conditions. Thus, when an initial mask inspection for defects has been performed and potential defects have been identified, the job-based defect analysis tool can be used to simulate the wafer exposure based on captured images of the mask areas surrounding the potential defects. In this way, the printability of mask defects can be directly analyzed without the expense of an actual wafer exposure. Further, as described below, the simulation can be computed to take into account any number of parameters associated with the mask, inspection system, and stepper (which controls the photolithography process), thereby increasing the accuracy of the printability determination.

Workflow Overview

Figure 1B:
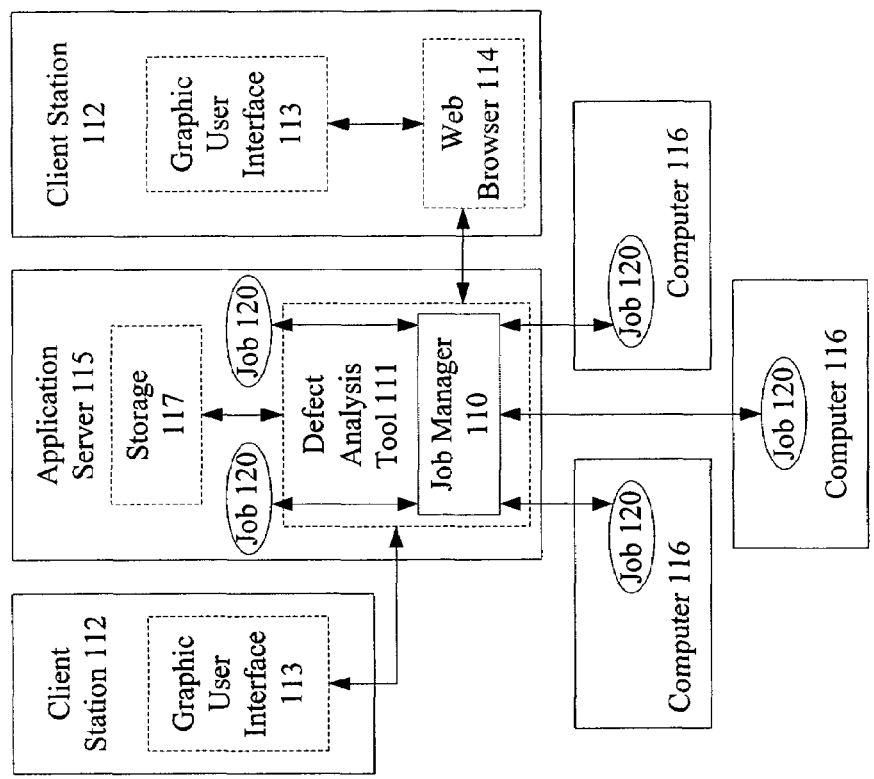
FIG. 1B illustrates a system configuration in which a job manager can manage and distribute a plurality of jobs to a plurality of computation resources.
Figure 1A:
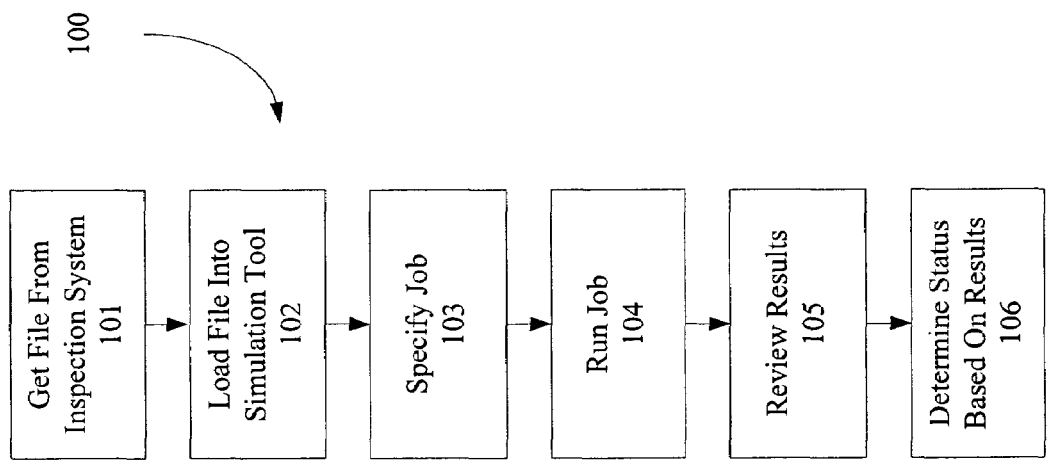
FIG. 1A illustrates an exemplary workflow 100 that can be used to determine whether a mask passes inspection, should be repaired, or needs to re-manufactured.

FIG. 1A illustrates an exemplary workflow 100 that can be used to determine whether a mask passes inspection, should be repaired, or needs to re-manufactured. In step 101, a mask file from an inspection system can be obtained. In one embodiment of step 101, the mask file can be converted into a standard mask format file (MFF) using a file conversion tool. MFF format can include standard formats for inspection records (e.g. inspection system models, inspection modes, inspection orientations, and time resolution), mask property records (e.g. mask type, mask materials, and the transmittance and phase of certain mask materials), defect records (e.g. defect ID, coordinate, defect size, defect classification, defect image, reference image, and difference image), and other records. This file conversion tool is further described in reference to FIG. 10. In step 102, the mask file can be loaded into a defect analysis tool that can generate wafer simulations and defect scoring.

In step 103, a user can specify a job associated with the mask file. Of importance, the user can specify the parameters associated with the mask itself, the inspection system used to provide the mask information captured in the mask file, and the stepper(s) that can be used to expose the mask. These set parameters ensure accurate defect analysis results, thereby allowing the user to make the most informed decision possible regarding the disposition of the mask.

Also of importance, the set parameters can be applied to all the simulations and defect severity score computations performed for the mask. That is, the defect analysis tool can process defects on the mask identically, thereby allowing the defect analysis tool to advantageously schedule each job in an extremely time efficient manner. For example and referring to FIG. 1B, a defect analysis tool 111, which is run on an application server 115, can receive job requests from one or more client stations 112 (i.e. the hardware used by the users, which could include computers, workstations, and/or servers).

Specifically, defect analysis tool 111 can use a job manager 110 to manage and distribute a plurality of jobs 120 (wherein jobs 120 could be multiple jobs or portions of one or more jobs). Jobs 120 can be run on any server-side node (generically, any type of computation resource) of a system, e.g. application server 115 itself and one or more computers 116, thereby significantly increasing the processing speed of defect printability analysis. Note that although job manager 110 is shown implemented within defect analysis tool 111, job manager 110 can be implemented separately from defect analysis tool 111 in other embodiments.

In one embodiment, defect analysis tool 111 can generate a graphic user interface 113 to facilitate communication with a client station 112. In another embodiment, a client station 112 can use a web browser 114 and graphic user interface 113 to facilitate remote communication with defect analysis tool 111.

Advantageously, defect analysis tool 111 can determine what defect printability analysis is associated with each job request and can automatically identify the tasks associated with that analysis. Job manager 110 can continuously compile and/or divide these tasks into jobs 120. Job manager 110 can also continuously compile and/or divide the results from jobs 120. In one embodiment, a computer 116 can automatically provide its results from job 120 to job manager 110 when finished. In another embodiment, a computer 116 can store its results from job 120 until job manager 110 requests the results. Defect analysis tool 111, which can process the results from job manager 110, can then transfer such results to an accessible storage means 117. Note that storage means 117 could be implemented integrally with or implemented separately from application server 155.

Referring back to FIG. 1A, because the processing of the mask defects can occur in parallel, the defect analysis tool can quickly provide a user with accurate simulation results. These results can aid a user in making decisions regarding whether the mask should be repaired before being used to manufacture integrated circuits. Thus, using the defect analysis tool with job automation can advantageously shorten the time-to-market of integrated circuits made using the analyzed mask.

After the job runs in step 104, a user can review the results of the defect analysis. Various levels of review can be provided in step 105. For example, in one embodiment described in reference to FIGS. 7–9, a Level 1 review can include an overall summary of the simulation and defect scoring results, a Level 2 review can include a defect map of the mask and CD variation of a feature most affected by each defect, and a Level 3 review can include a detailed analysis of each defect.

Based on such reviews, the user can assign a status to each defect on the mask in step 106. In one embodiment, multiple users can assign different statuses to the same defect, wherein the status assigned by one user can override the status assigned by another user. These statuses can provide a user information as to whether the mask is ready to be used in the photolithographic process as is, needs repair before being used, or must be re-manufactured.

Exemplary Embodiment of Defect Analysis Tool

FIGS. 2–9 illustrate screen shots (called pages herein) from an exemplary embodiment of a defect analysis tool. These pages can capture and organize information about tool use (e.g. administration, maintenance, and security), parameters the tool will need for the analysis, and reviews by users of the tool.

In general, each page includes a main menu bar, which can serve as a navigator to take the user to a different operation. In one embodiment, these operations can be grouped under the following headings: Settings, Job, Review, Administration, Maintenance, and Security. Note that the pages described below are illustrative only. Thus, other defect analysis tools may include pages that capture and organize information in a similar or different way. For example, in one embodiment, the tools can be implemented using a Web-based interface that allows multiple servers to respond to user inputs.

Mask Settings

In general, the Settings pages allow a user to input parameters used to perform the simulations on the mask. Specifically, the defect analysis tool can build simulation models based on the parameters input by a user. In one embodiment, these input parameters can relate to mask settings, stepper settings, and inspection system settings.

FIG. 2 illustrates a mask setting page 200 that can capture and organize information about a mask the user desires to analyze. Note that this mask information corresponds to a real mask that has been manufactured and tested.

To create a new mask entry, the user can type the name of the mask in the Name textbox. This name could be an arbitrary name assigned by the user, who could work in a design company, a mask shop, or a wafer fabrication facility. In one embodiment, a pull-down menu can be provided for the type of mask. For example, the pull-down menu could provide the user with a choice between, among other options, a binary mask and an attenuated phase shifting mask (ATT-PSM).

Selection of "ATT-PSM", could trigger prompting of additional mask information. In one embodiment, this additional mask information could include information about the phase and transmission of the mask (which can be input in the appropriate text boxes). The phase refers to the degree of phase shift on the mask background. In one embodiment, the default value of phase shift is 180 degrees. The transmission refers to the percent of light transmitted through the mask background at the stepper wavelength. In one embodiment, the default value for transmission is 6.0%.

After information regarding the new mask is entered in area 201, the user can click the Add button to transfer the information to a table 202, which organizes the information on potential masks that can be used in the simulation. In one embodiment, the information regarding an entered mask can be edited by clicking on the appropriate Edit link in table 202. In the edit mode, any information (i.e. Mask Type, Mask Name, Phase, and Transmission) can be modified. After editing, the user can click an Update button to save the modified information in table 202.

In mask setting page 200, a user can delete a mask by clicking the checkbox (shown to the left of table 202) corresponding to the appropriate mask and then clicking the Delete button. In this embodiment, the user can click the Delete All button to delete all masks from table 202.

Stepper Settings

FIG. 3 illustrates a stepper setting page 300 that can capture and organize information about a potential stepper that can be used in defect analysis. Note that this stepper information corresponds to a specific model of stepper that could be used to expose the mask. In stepper setting page 300, an area 301 can prompt a user to input information about the stepper.

To create a new stepper entry, the user can enter information using text boxes or pull-down menus. For example, the Name textbox allows entry of the name of the stepper model. The wavelength textbox allows entry of the wavelength (nm) of the stepper light source (e.g. 157, 193, 248 or 365 nm). The numerical aperture (NA) textbox allows entry of the sine of half the angle between the light cone of a lens as measured from the image. Exemplary NA values could include 0.55, 0.65, 0.7, and 0.8). The Stepper Reduction textbox allows entry of the ratio of the mask size to the real wafer size (e.g. 1, 2.5, 4 or 5). Not that the specific user interface mechanisms used for different areas can be adjusted, e.g. pull-down lists vs. text entry to the specific setting.

The Defocus pull-down menu allows entry of the position of the focal plane relative to the air/surface interface. The image depth (in nanometers) places where the image will be calculated in the photoresist/thin film. The distance between the focal plane and image plane is equal to the image depth minus the defocus. If no photoresist/thin film is specified, then the image depth is equal to zero.

In one embodiment, the user can choose between a single and a multiple defocus. The single defocus sets a single defocus model, whereas the multiple defocus enables three parameters to generate multiple optical system models with uniformly spaced defocus values based on the specified defocus range in nanometers. These parameters include the smallest defocus value (called a minimum), the largest defocus value (called a maximum), and the defocus step size (called an increment). Note that all defocus values mentioned above are relative values to the best focal plane.

The Illumination pull-down menu allows entry of the type of light source that can be used for defect analysis. In one embodiment, each selected illumination type can prompt the user to input at least one additional parameter. For example, circular illumination can have an associated coherence factor parameter, which indicates the coherent level of the stepper optical system. Values for the coherence factor are generally between 0 and 1. Annular illumination can have associated inner radius and outer radius parameters. Typically, these radius parameters are without units and normalized such that the maximum possible outer radius is 1.

Multipole illumination can have associated inner radius, outer radius, and number of poles parameters. Quadrapole illumination, which has 4 poles, is one example of multipole illumination. Note that if quadrapole illumination is selected, then the inner radius (r) and outer radius (R) are normalized so that the maximum possible R+r is 1. Quasar illumination can have associated inner radius, outer radius, and angle parameters. The angle parameter refers to the angle of inclusion, which is evenly distributed from either side of a centerline. The pattern that falls within this angle becomes the area of illumination.

Rectangular illumination can have four specified parameters: the length (X) and height (Y) as well as its position in the x-direction (x) and y-direction (y) from an origin. Custom illumination allows a user to design a custom illumination pattern. This pattern can be defined by parameters specified by the user.

In one embodiment, clicking an Advanced button opens a window that allows the user to modify other parameters. These parameters could include aerial image, model radius, model order, minimum number of iterations, a user interface for arbitrary illumination description, and/or other settings. The aerial image parameter could allow a user to select a polarization mode that computes optical intensity distributions in the simulation. For example, a scalar mode, which assumes that scalar fields can properly describe the electromagnetic fields, can be sufficient for use with simple illumination types. Therefore, in one embodiment, the scalar mode can be used as a default setting. In contrast, a vector mode uses vertical and horizontal field components during computation and therefore is more appropriately used for more complex illumination types.

A model radius parameter can determine the scope of aerial image simulation by specifying how far its neighbors can affect a feature's aerial image. A model order parameter can determine the order (complexity) of the stepper model. For example, the higher the model order, the more complex and accurate the model used in aerial image simulations. A minimum number of iterations parameter can specify the minimum number of iterations.

After information regarding the new stepper model is entered in area 301, the user can click the Add button to transfer the information to a table 302, which organizes the information on all possible steppers that can be used in defect analysis. In one embodiment, the information regarding entered steppers can be edited by clicking on the appropriate Edit link in table 302. In the edit mode, any information (i.e. stepper name, wavelength, NA, etc.) can be modified. After editing, the user can click an Update button to save the modified information in table 302.

In stepper setting page 300, a user can delete a stepper by clicking the checkbox (shown to the left of table 302) corresponding to the appropriate stepper and then clicking the Delete button. In this embodiment, the user can click the Delete All button to delete all steppers from table 302.

Inspection System Settings

Figure 4:
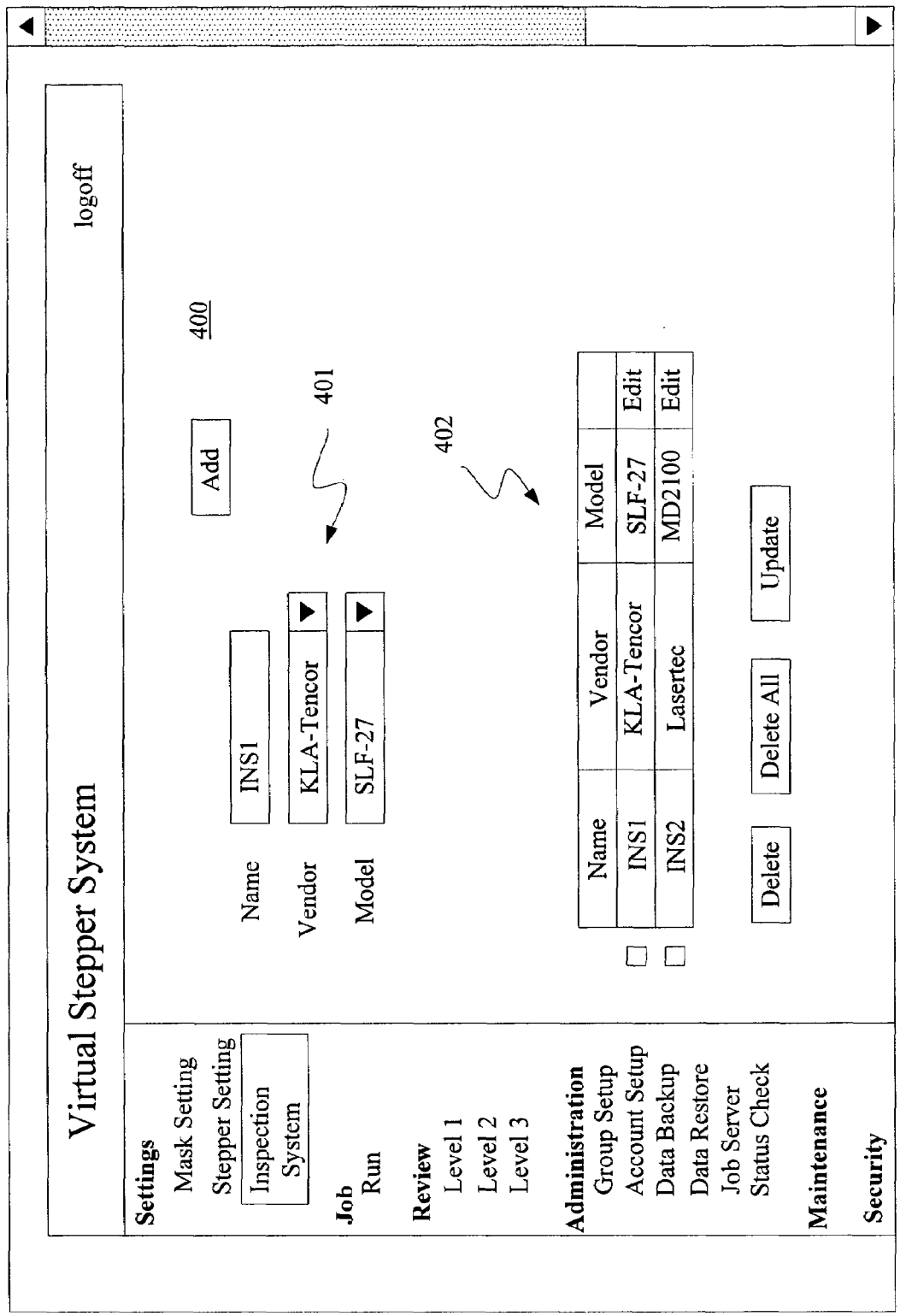
FIG. 4 illustrates an exemplary inspection system setting page that can capture and organize information about the inspection systems that were used for inspecting the masks.

FIG. 4 illustrates an inspection system setting page 400 that can capture and organize information about the inspection systems that were used for inspecting the masks. For example, an area 401 can prompt a user to input information about a new inspection system that could be used for defect analysis.

To create a new inspection system entry, the user can input information using textboxes and pull-down menus. For example, the Name textbox can allow entry of the name of the inspection system (e.g. the name used by the user). The Vendor pull-down menu can allow entry of the inspection system provider, such as AMAT, KLA-Tencor, Lasertec, Leica, and Zygo.

Selection of a vendor could change the Model pull-down menu. For example, if a user selected AMAT as the vendor, then the Model pull-down menu could list ARIS-21i and ARIS-100i. In contrast, if the user selected Zygo as the vendor, then the Model pull-down menu could list KMS 100, KMS 450i, KMS 450g, and KMS 400.

After information regarding the new inspection system is entered in area 401, the user can click the Add button to transfer the information to a table 402, which organizes the information on the inspection systems used to provide mask data. In one embodiment, the information regarding entered inspection systems can be edited by clicking on the appropriate Edit link in table 402. In the edit mode, any information (i.e. name, vendor, and model) can be modified. After editing, the user can click an Update button to save the modified information in table 402.

In inspection system setting page 400, a user can delete an inspection system by clicking the checkbox (shown to the left of table 402) corresponding to the appropriate inspection system and then clicking the Delete button. In this embodiment, the user can click the Delete All button to delete all inspection systems from table 402.

Administration

An administration page can allow a user to access pages with information regarding a Group Setup, a User Accounts, a Data Backup, a Data Restore, a Job Server, and a Status Check. For example, the Group Setup page can include a list of the domain accounts that allow a system administrator to organize people into logical groups that reflect their rights, privileges, and responsibilities within the system. A User Accounts page can be used to view, add, and delete user account information. In one embodiment, the User Accounts page can include a list of users that may be sorted by each heading. A Job Server page can display the host, port, and engines used to run jobs. Additional engines, as well as email information, can also be added using this page. A Status Check page can display the status of the job server, e.g. the number of jobs in the queue, the server name(s), and whether the server is idle or running a job.

Maintenance Utilities

FIG. 5 illustrates an exemplary maintenance page 500 that can serve two purposes. First, maintenance page 500 can enable the user to prune the database of unwanted simulation data, thereby decreasing the database size. Second, maintenance page 500 can allow the user to compress mask files, stepper settings, and data results for transfer to another database.

To prune the database, the user can choose beginning and ending creation dates for the data to be pruned using calendar pull-down menus 501. After the user clicks the Go button, the system can return a table 502 of Maintenance History. In one embodiment, table 502 can be sorted by Record ID, Mask ID, Serial Number and Creation Time.

To delete all the records shown in table 502, the user can click first on the Select All button and then click the Delete button. To delete certain records shown in table 502, the user can check the box (to the left of table 502) corresponding to the Record ID to be pruned and then click the Delete button. To delete portions of the records shown in table 502, the user can select the appropriate deleted portion from a pull-down list 503. In one embodiment, the user can choose Full or Image Only from pull-down list 503. Note that a Full delete clears the database of that mask record. In contrast, an Image Only delete prunes out the images but leaves the other simulation and defect scoring results in the database.

In one embodiment, the defect analysis tool allows a user to compress all of the specified data, e.g. the simulation data, defect scoring data, and set parameters, and send the compressed file to an address indicated by the user. To prepare a compressed file transfer, the user can click the Record ID button of the results to be transferred in table 502, thereby opening a transfer page. At this point, the defect analysis tool can provide a default file name and a path name. The user can then click a Generate button to create and send the compressed file.

In one embodiment, simulation results from an external source can also be imported using maintenance page 500. These simulation results can be placed as a zip file in a directory accessible by the server of the defect analysis tool. To import externally generated simulation results, the user can click on an Import Results button 504, thereby opening an import results page. This import results page can prompt the user to input a path name as well as a file name in a textbox. Alternatively, the user could click a Browse button and use a Choose File dialog box to locate the file. In one embodiment, the user may have the option to either duplicate or overwrite the imported file.

Security

A Security page (see the main menu) maintains privileges to access and view the masks that have been imported. Typically, a system administrator can determine a user's access to any particular mask data. In one embodiment, the system administrator can grant privileges to groups. In another embodiment, an "access all mask data" privilege can be granted when setting up a group. In such a case, all members of this group will be able to access all mask data stored in the server without explicitly granting access at Security page.

Jobs

Figure 6A:
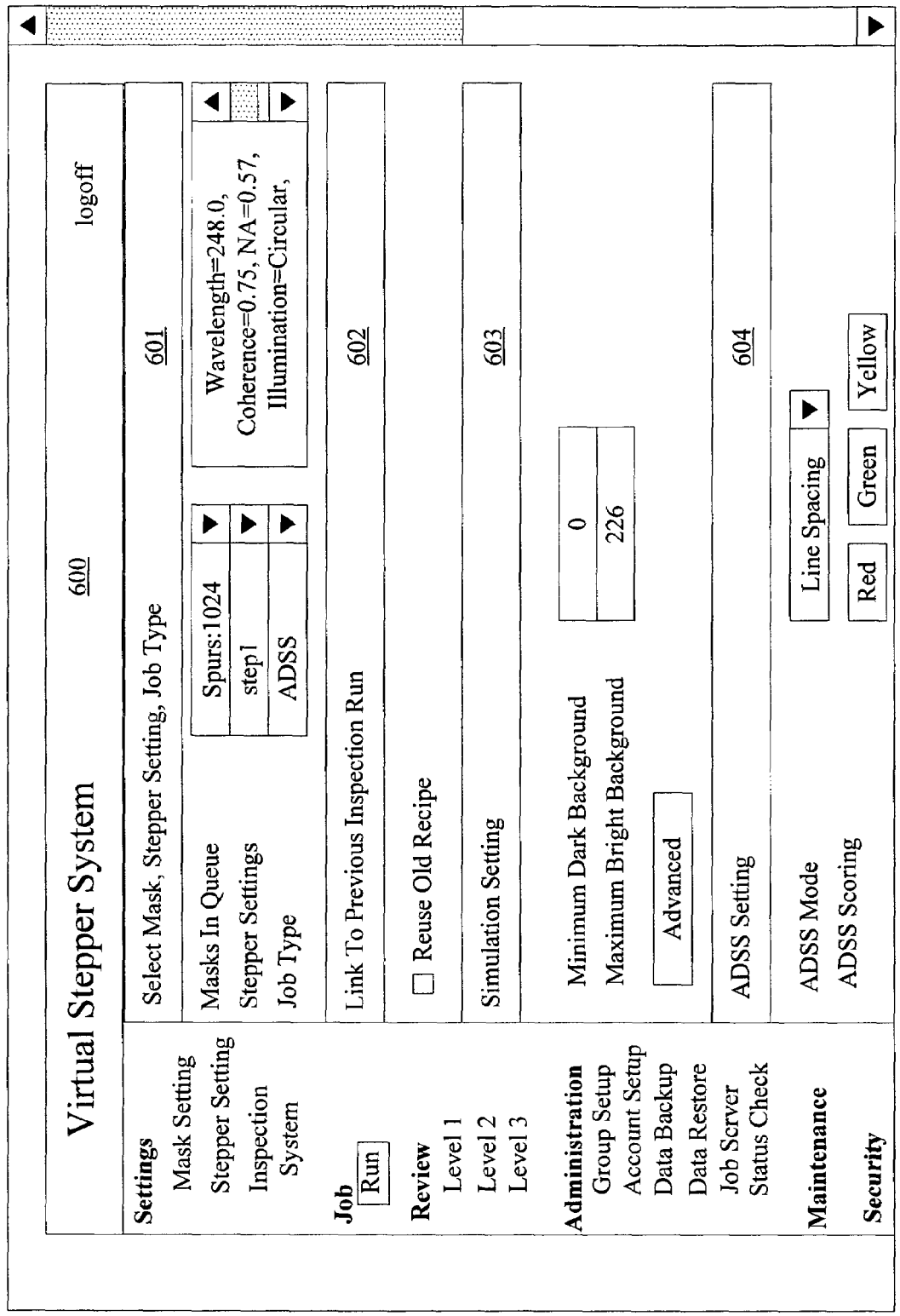

FIGS. 6A and 6B illustrate an exemplary run page 600 that allows a user to run a defect analysis job. An area 601 of run page 600, entitled Selecting Mask, Stepper Setting, And Job Type, includes three pull-down menus. A Masks in Queue pull-down menu can indicate all of the mask files that are in the queue to start a job. In one embodiment, the mask files can be listed in the order that they were received in the queue. A Stepper Settings pull-down menu can indicate all the stepper settings previously defined. Note that a text box to the right of the Stepper Settings pull-down menu contains the detailed information regarding the stepper settings. A Job Type pull-down menu specifies the type of test to run to examine the defects. In one embodiment, the tests are referenced as ADSS (automatic defect severity score) or simulation. Computing an ADSS is described in U.S. patent application Ser. No. 09/814,023, entitled "System and Method Of Providing Mask Defect Printablity Analysis", filed on Feb. 28, 2002, and incorporated by reference herein.

Another area 602 of run page 600, entitled Link to Previous Inspection Run, includes a check box. If the user checks this box, the defect analysis tool reuses an old recipe, i.e. a series of steps to execute a function, such as simulation or ADSS, previously used for a particular mask (if available).

Yet another area 603 of run page 600, entitled Simulation Setting, includes various parameters that can be set. For example, a Minimum Dark Background can specify the minimum dark background value for the mask image whereas a Maximum Bright Background can specify the maximum brightness background value of the mask image.

Clicking the Advanced button can open a page requesting entry of additional parameter values. In one embodiment, a grid size parameter can specify the size of the simulation grid, which is dependant on the inspection system and reduction factor specified in the stepper settings. An output pixel size parameter can specify the size of the output pixel, which is dependant on the original mask pixel size. In one embodiment, the default output pixel size can be equal to the grid size. An interpolation scale parameter can specify how much smaller the pixel size is for analysis as compared to the inspection system pixel size (wherein the smaller, the scale the more accurate the result).

Yet another area 604 of run page 600, entitled ADSS Setting, includes an ADSS mode parameter that can specify whether a line spacing mode or a contact hole should be used. This parameter can specify the main pattern of the particular mask data, e.g. contact hole (for contact and via patterns) or line/space (for all non-contact patterns). Note that ADSS can advantageously use different algorithms to calculate the severity scores based on the appropriate pattern. An ADSS score setting parameter can assign a score to each available color, e.g. Red, Green, and Yellow. In one embodiment, the default color setting can be Green (0–3.5), Yellow (3.5–5), and Red (5–10).

Yet another area 605 of run page 600, entitled Threshold Setting, defines a user-acceptable CD variation (i.e. tolerance)(e.g. a plus and minus percentage). In one embodiment, various colors can indicate CD proximity to the set tolerance. For example, the ADSS result could change from green to yellow when the wafer CD on defect image nears the tolerance (e.g. −5.0% or +10%).

Areas 606 and 607 of run page 600, entitled Use Auto Thresholding and Use Manual Thresholding, respectively, allow a user to set thresholds (used to determine the edge position on a wafer from an aerial image simulated by the defect analysis tool) either automatically or manually (in one embodiment, one of these two circles must be checked). If auto thresholding is chosen, then the user can either enter in the mask and wafer CD values along with a tolerance (if necessary) or check an automatically computed wafer CD, i.e. Wafer CD=Mask CD/Reduction+n % bias, wherein the user inputs the bias value and the mask CD is measured from mask images. In one embodiment, multiple CD values can be specified by separating each value with a space.

If manual thresholding is chosen, then the user can manually enter the threshold value (e.g. nominal) and the process window range (see area 608). The process window range defines a set of allowable exposure and defocus values within which the printed wafer patterns meet manufacturing specifications. In one embodiment, the exposure parameter can be defined as a plus and minus percentage. The defocus parameter can specify the defocus values via pull-down lists. The defocus parameter refers to the position of the focal plane relative to the air/resist interface. In one embodiment, the positive defocus direction is into the resist. Note that the distance between the focal plane and the image plane is the absolute difference between the image depth and the defocus.

A user can start a job by clicking a "Go" button. In one embodiment, the user can submit multiple jobs for one set of mask data. To do this, the user can click a "Submit" button after specifying the parameters for each job. After submitting the parameters, the "recipe" for that job can appear at the bottom of run page 600 as a reference. In one embodiment, multiple recipes can appear at the bottom of run page 600. The user can then start the jobs by clicking the "Go" button.

Reviews

The review pages can advantageously display all job runs and results that are stored in the defect analysis tool database. Users can evaluate this information and run additional simulations, perform one-dimensional analysis, and calculate additional ADSS on completed jobs.

FIG. 7 illustrate an exemplary Level 1 review page 700 that allows a user to search for a completed defect analysis job. To search for completed jobs, the user can input the inspection system used, the creation dates (Created Between and To), and the name of the file that was provided by the inspection system or the user (Lot name). After clicking the Search button, the defect analysis tool can generate a table for each job run on a mask. Each table can include the following headings: the internal ID set by the system and used by the database (ID), the mask ID set by the system and used by the database (Mask ID), the quality of the mask as designated by the fabrication facility for mask transfers (Grade), the date and time when the job started (Date In), an indication of whether the job has been reviewed (Reviewed), the current inspection stage (QC Type), a customer name that gives the order of the mask (Fab User), the status of the job (Job Status)(e.g. completed, running, not yet started), the inspection system used in the job (Inspection System), the mode of the inspection system (Inspection Mode), and the job type (Recipe) (e.g. simulation or ADSS).

In one embodiment, clicking the ID heading or the Reviewed heading displays a Level 2 Review page. In one embodiment, clicking the Recipe heading displays the settings used to run the job.

Figure 8:
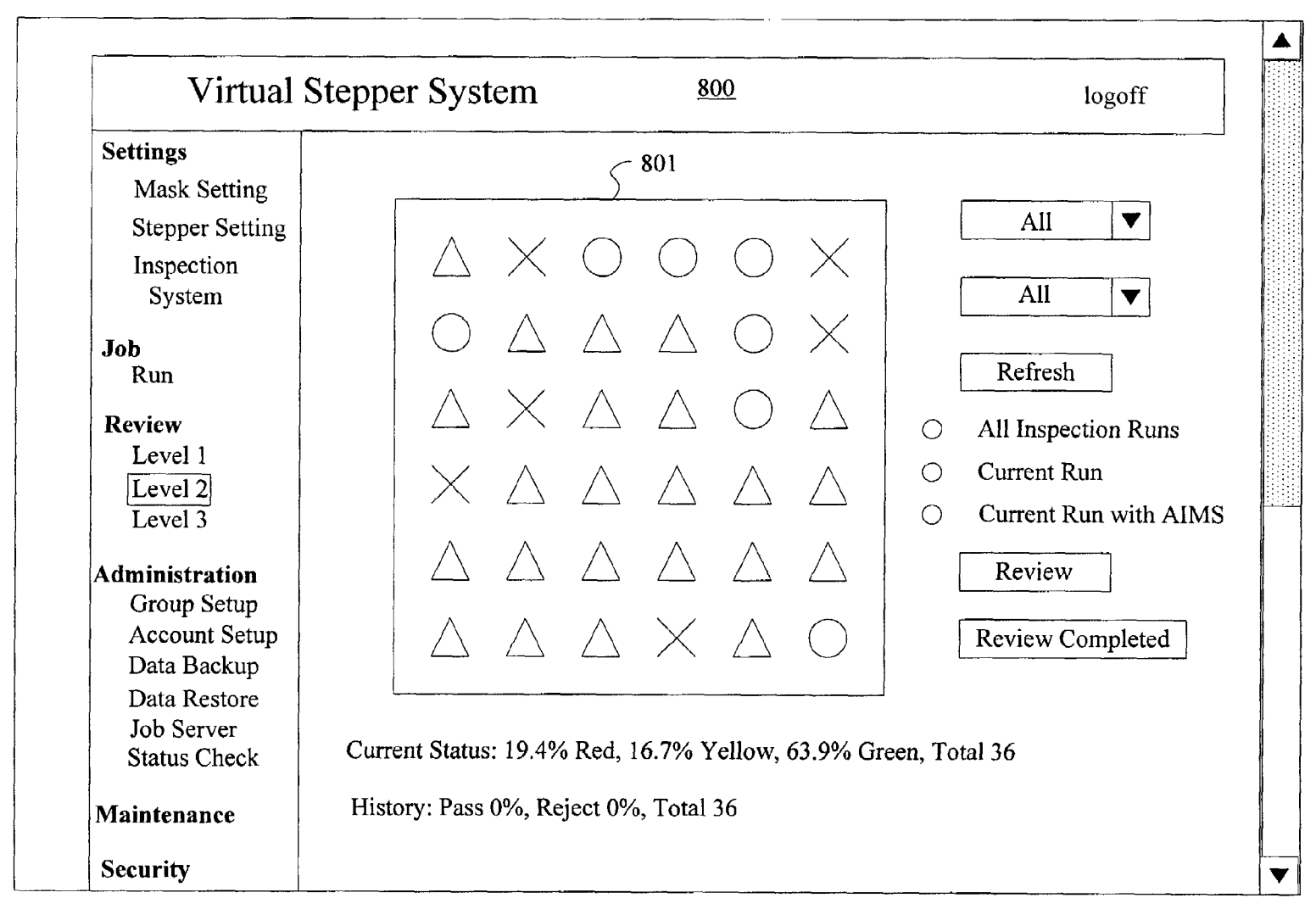

FIG. 8 illustrates an exemplary Level 2 review page 800 that allows a user to filter defects for further review (i.e. for the Level 3 review). In one embodiment, a defect map 801 of the mask can be represented with locations determined by an X-Y coordinate system entered in the file conversion tool. Each defect can be color-coded based on its severity score.

In one embodiment, red defects (indicated as circles in page 800) impact the wafer and require repair. Yellow defects (indicated as X's in page 800) are questionable as to whether they impact the wafer or not. Thus, yellow defects may require additional analysis, which can be performed by an operator or process engineer. Green defects (indicated as triangles in page 800) passed the test and are considered nuisance defects. In other words, green defects will not print on the wafer or will not affect any features and, therefore, do not require repair. Note that defect scores that are higher than a predetermined value can be displayed with a different color or in a different manner to facilitate ease of recognition. For example, in one embodiment, extremely severe defects (i.e. those that could be very difficult to repair) could be represented by a flashing red light.

Defect map 801 can provide valuable information to the user in an easy to understand format. Specifically, a user can easily identify which areas of a mask (e.g. areas for forming memory, logic, test features, etc.) have serious defects. This information could affect the user's assigned status to the mask. For example, if serious defects occur only in the test features area, then the user may assign the mask a Pass status (i.e. the mask can be used as is) irrespective of the number of serious defects.

A current status of the mask with the total number of defects (in this case 36) and the percentages in red, yellow and green can be provided in page 800. A history of passes, holds, rejects, and the total number of actions taken on the defects can also be provided in page 800.

In one embodiment, Level 2 Review pate 800 can further include a defect table, which can include the following headings: the defect ID from the KLA RF file or system generated ID if from a non-KLA RF file (Defect ID), the automatic defect severity score (ADSS), the reference critical dimensions measurement (Ref CD), the defect type (Type), the KLA RF defect class (Class), the percentage of critical dimension at best exposure, best focus (CD@BEBF), the percentage of critical dimension at best exposure, worst focus (CD@BEWF), the percentage of critical dimension set for the negative exposure range, best focus (CD@-EBF), the percentage of critical dimension set for the positive exposure range, best focus (CD@-EBF), an indication whether AIMS results are available or not (AIMS), and the defect's current status (Status)(e.g. waive or pass).

In one embodiment, defects can be reviewed in total or filtered to see particular criteria. For example, a user may only want to view Red-coded defects in defect map 801. In that case, the user can set the pull-down menus to Red. The user can also display a defect map with color combinations.

For example, the user can view Yellow- and Green-coded defects by setting the two pull-down menus appropriately. Thus, the two pull-down menus can provide a filtering function. In other embodiments, additional filters can be provided. These filters could include Defect Type, Holds, Repairs, Rejects, Passes, Waives, and ADSS Failed.

After the user clicks the Refresh button, the filtered information can be displayed on defect map 801 as well as in the defect table (not shown). At this point, the user can choose what to review on the Level 3 Review page. In one embodiment, the selections available are: All Inspection Runs, Current Run, and Current Run with AIMS. When the user selects one or multiple items of those selections, the defect analysis tool can look for the specified data stored in the database for that mask (wherein the data would have the same mask ID and serial number). To proceed to the Level 3 Review, the user can click the Review button.

Note that after reviews are completed on the Level 3 Review page (see FIG. 9), the user can be returned to Level 2 Review page 800 to complete the process. In one embodiment, after all reviews are complete, the user can click the Review Completed button. At this point, the user may be prompted to choose a Name for the menu to send an e-mail notification regarding the completed review, to write a review summary in a textbox, and to send the notification and associated review summary.

Figure 9:
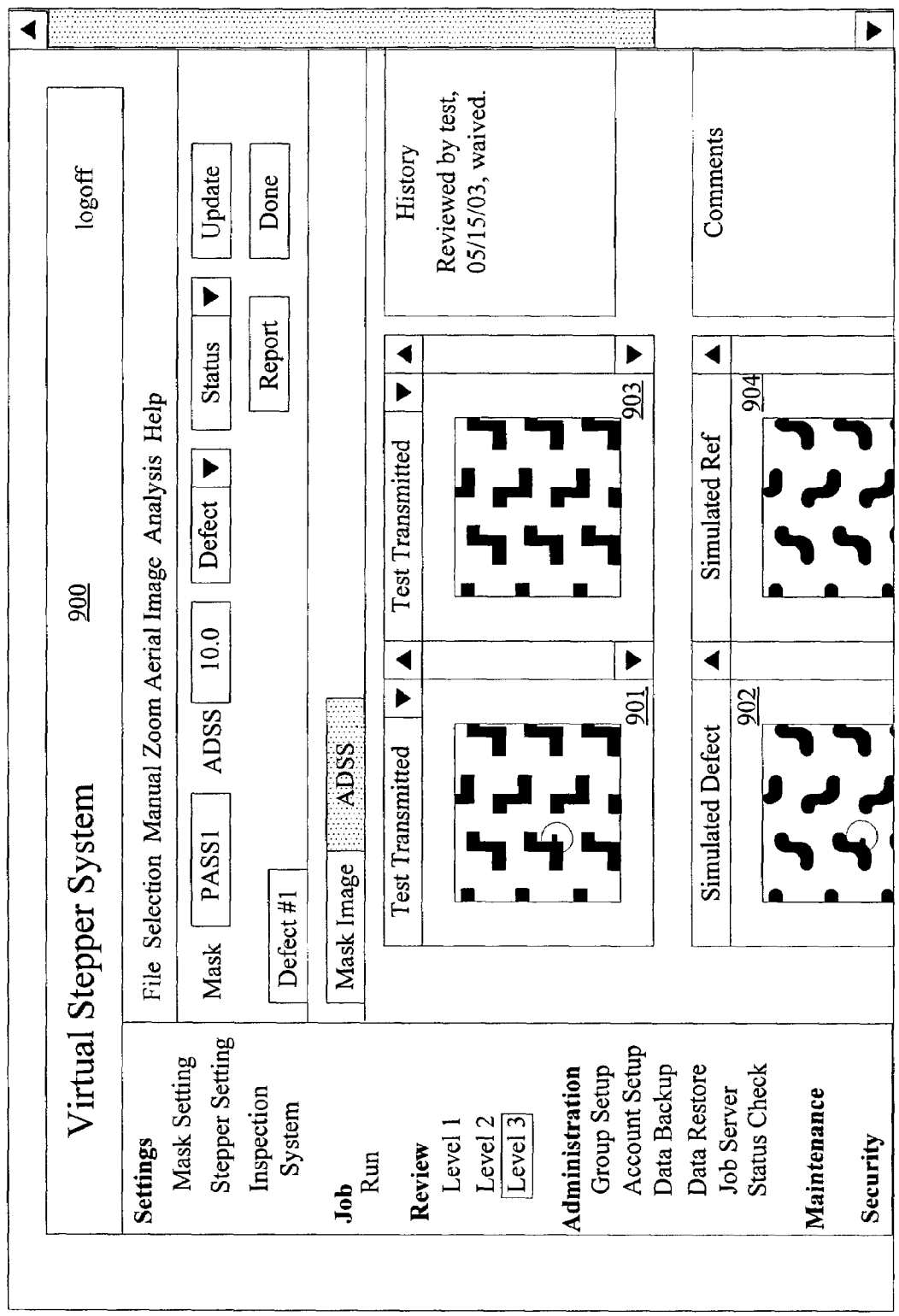
FIG. 9 illustrates an exemplary third level review page that allows the user to individually view each defect and reference image pair along with the simulated results.

FIG. 9 illustrates an exemplary Level 3 review page 900. The Level 3 review allows the user to individually view each defect and reference image pair along with the simulated results. The defect can be marked (in this case using a dotted circle) on the defect image as well as the simulated image of the defect. In one embodiment, if the mask was linked to a previous mask image (e.g. pre-repair)(i.e. inspection data collected after the mask is made, but before the mask is sent to be repaired), then the results of the previous mask are visible by clicking on the side tabs.

In one embodiment, the user can access any defect image using a pull-down menu Defect. In page 900, results for Defect #1 are illustrated. The user can assign a designation for the reviewed defect by using a pull-down menu Status. Typical designations can include Hold (i.e. the user wants a subsequent user to make the decision regarding the defect), Pass (i.e. the user believes the defect doesn't need repair), Repair, Waive (i.e. the user indicates that the defect does not affect printability for a defect marked as Hold by a previous user), or Reject. The user can save the status designation for each defect by clicking the Update button.

A History section indicates the previous history of the defect, e.g. displaying previous reviewers and assigned defect status designations. A Comments section allows a user to add notes, which cannot be edited or deleted.

Clicking on an ADSS tab can show the defect scores, defect coordinates, stepper parameters, and the CD values at different defocus levels for each job parameter. In one embodiment, if there was a previous inspection stage (i.e. pre-repair) that was associated with the new job, then the user can view the defect from a previous job by moving the side tabs next to each image.

A user can draw horizontal/vertical cut-lines on the images to generate one-dimensional analysis results of the defects on the images. In one embodiment, the user can access cut-line functionality by clicking on Selection (provided on the menu bar) and then using a mouse to click and drag a line through the desired feature. At this point, the user can click on Analysis in the menu bar and then select Perform 1-D Analysis to generate simulation results.

In one embodiment, the user can be prompted to enter six sets of parameters before performing one-dimensional analysis: Plot, Measure, Model, Exposure, Mask, and Resist. These sets of parameters will now be explained in further detail.

The Plot parameter can be used to select the following exemplary outputs: an Aerial Image Intensity vs. Position, a Feature Size vs. Exposure Level, a Feature Size vs. Defocus, a Process Window, and a Latitude Tradeoff Curve.

The Aerial Image Intensity vs. Position output can be selected to generate an intensity profile. Specifically, this output provides a plot of the calculated intensity along the coordinates of the cut-line.

The Feature Size vs. Exposure Level output can be selected to create a plot of the feature size variations with exposure energy for the first user-defined cut-line. Note that the nominal exposure dose is that exposure energy per area that will result in the target feature size (hence, dose-to-size). In one embodiment, the nominal exposure dose can be calculated for the selected defocus and then printed at the bottom of the plot.

The Feature Size vs. Defocus output can be selected to produce a CD versus defocus plot for stepper models. If this option is chosen, then a Multiple Defocus setting must be selected.

The Process Window output can be selected to generate extractions for multiple cut-lines and define a common process window (exposure deviation vs. defocus). A process window for a single cut-line, by definition, is that region of exposure levels and defocus values for which the line width remains within the user-specified tolerance. The boundary of this region can be provided in the Process Window output. Exposure deviation is simply the percent change in exposure dose from the defined nominal value. Similarly, a common process window can be defined as the common area of all of the individual process windows. The common process window is that region of exposure levels and defocus values for which all of the line widths remain within tolerance.

The Latitude Tradeoff Curve output can be selected to calculate exposure latitude/depth-of-focus trade-off curves. This plot can be derived from the Process Window plot. Specifically, for each drawn cut-line, the defect analysis tool can plot the curve that represents the set of rectangles that can be inscribed inside the process window. The common process window can be used to generate the common latitude tradeoff curve. In one embodiment, the maximum operational exposure-defocus region can also be shown. Note that because the individual process windows for each cut-line overlap, the common latitude trade-off curve may not match any of the individual trade-off curves.

The Measure parameter allows the user to specify the target CD, tolerance, and measurement mode. The target CD specifies the desired size for the CD in nanometers. The tolerance defines the acceptable CD variation used in deriving the process window. The measurement mode selects the measuring mode based on resist line (i.e. measurement of the feature) or the resist trench (i.e. measurement of the spacing distance between neighboring features, such as poly or contact holes).

The Model parameter can be used to specify the model and simulate the image for single defocus or multiple defocus. To run simulations for multiple defocus values, a user can select the defocus range from values supplied with the defect analysis tool.

The user can set the following additional parameters for such a simulation: Model, Output Pixel Size, Boundary Condition, and Defocus Settings. The Model parameter can select the model to be used in the simulation. The Output Pixel Size parameter can specify the size of the output pixel, which is dependant on the original mask pixel size. In one embodiment, the default value can be set equal to the model grid size. The Boundary Condition parameter can specify the boundary format for the mask. Exemplary boundary formats include Repeat the Border (which extends the image by repeating the border) or Doubly Periodic (which duplicates the image). The Defocus Settings parameter can be set to Single Defocus or Multiple Defocus.

If Multiple Defocus is selected, the minimum, maximum, and step values may be required. The Minimum value is the smallest defocus value in the selected model. The Maximum value is the largest defocus value in the selected model. The Step value is the step of two adjacent defocus models.

The Exposure parameter can be used to calculate and/or use the optimal exposure. In one embodiment, the defect analysis tool can automatically calculate and apply the appropriate exposure such that the first cut-line will yield a CD equal to the specified target (dose-to-size). The Exposure parameter can also set the nominal exposure in accordance with a user-specified fixed exposure value. The Exposure parameter can also optimize the exposure level to maximize the defocus window within the user-specified exposure ranges. Note that the normalized exposure levels are in terms of the ratio of normalized flood intensity to the intensity threshold at which the CD is derived.

The Mask parameter can be used to specify the mask information for performing one-dimensional analysis. For example, the user can specify the Minimum Dark (which defines the feature gray scale with a lowest allowable value of zero), and the Maximum Bright (which defines the open space gray scale with a highest allowable value of 255). In one embodiment, the defect analysis tool can use default values to run the jobs.

The Resist parameter can be used to specify the photoresist information used to record pattern imaging. Such photoresist information can include the resist type (e.g. positive or negative), the process non-linearity (which specifies the contrast of the photoresist in nm), and the resist model. In one embodiment, the resist model can be indicated as simple threshold or first order. The simple threshold specifies the aerial image intensity threshold model. This value can be set equivalent to the zero-resist thickness or to the infinite gamma. In contrast, the first order specifies the first-order resist mode. If this model is chosen, the depth, process non-linearity, and absorption factor must be specified.

Simulating an Aerial Image

Aerial images can advantageously provide an initial indication of whether a given defect will print or not. If a defect is much smaller than the stepper wavelength and is isolated from critical portions of the circuit, then the defect will not show up in the aerial image. Some defects and those close to critical circuit features will need further analysis to determine printability.

In one embodiment, to generate an aerial image interactively for a particular defect, the user can click on Selection in the menu and Select Highlight in the associated pull-down menu. At this point, the user can click on Aerial Image in the menu and Calculate in the associated pull-down menu. This set of steps opens a Set Simulation Parameters dialog box with the defect settings. The user can set the parameters discussed above in reference to Simulation Settings.

Once the parameters are set, the defect analysis tool can calculate the simulation and display the pseudo-color aerial image result in a new window adjacent (in page 900, directly below) the original mask image window. The pseudo-colors can represent the intensity of the aerial image (e.g. red indicating high intensity and blue indicating low intensity). For example, page 900 illustrates four windows. Two windows 901 and 902 represent the original mask image including a defect and the corresponding simulated mask image using pseudo-colors (colors not shown), respectively. Two windows 903 and 904 represent the reference mask image (which corresponds to the original mask image including the defect) and the corresponding simulated reference mask image using pseudo-colors (once again, colors not shown), respectively.

In one embodiment, a wafer image plot can be overlaid on top of the pseudo-color image. The user can generate this plot by clicking Selection on the menu bar and then Wafer Image Plot in the associated pull-down menu.

In one embodiment, only the most recently analyzed mask simulation is shown as images on page 900. In one embodiment, a repository bar on page 900 could temporarily store other simulation results. To access the other simulation results, a user could click on the repository bar to display a pull-down menu. After selecting the desired simulation job, the appropriate simulation images could replace those currently displayed on page 900.

ADSS Analysis

The defect analysis tool can also provide automatic defect severity score (ADSS) analysis. In this analysis, the user can manually select various parameters or, alternatively, the tool can automatically set such parameters. These parameters can relate to threshold values of the wafer and mask CDs, the alignment area, and the defect area.

To start an interactive ADSS analysis for a particular defect, the user can click on Analysis in the menu bar and then select ADSS. At this point, the user can indicate whether certain parameters are set manually or automatically. The Threshold parameter can define the intensity contour level that is expected to fall within the region bounded by the tolerance associated with each side of the directed edge. If set automatically, then the tool refers to the Measure parameter.

If parameters are to be set manually, then the user must specify the mask and wafer CD measurements using a Measure tab. The defect analysis tool automatically uses thresholds based on the CD information for calculating ADSS. If parameters are to be set automatically, then the defect analysis tool calculates the ADSS with the user-specified thresholds and nominal (e.g. average threshold value) threshold parameters.

The measure parameter can specify the CD on the mask and on the wafer for the ADSS calculation. In one embodiment, the user can specify multiple CD values by separating each value with a space. If the user wants to manually set the CD size, then the user can define the desired wafer CD size (i.e. the Target Wafer CD). If the user checks Automatic Select Cut-lines, the defect analysis tool will automatically determine optimal cut-line locations to apply to the ADSS calculation. If unchecked, at least one cut-line must be drawn on the mask image and a value for the Target Wafer CD parameter must be specified in order to apply these cut-lines and settings to the ADSS calculation. If the user does not provide the cut-lines (i.e. the user checks Automatic Select Cut-Lines), then the user can specify a percentage of the mask CD value to provide for tolerance (which apply to mask CDs)(called a Mask Width Change Limit). In this case, the program will look for cut-lines that satisfy the mask CD value plus/minus the tolerance. In one embodiment, the default value is 0.2, indicating a 20% tolerance for the mask CD value.

The ADSS mode parameter selects the ADSS mode of the measured feature. In one embodiment, these modes can include Line/Spacing (i.e. the measured feature is a line or a space), Contact (i.e. the measured feature is a contact), Measuring (which selects the measurement mode), Line (which measures the feature area), and Trench (which measures the spacing distance between neighboring features, such as poly or contact holes).

The model and mask parameters are substantially the same as that described for one-dimensional analysis and therefore is not repeated.

Analyzing Defects with Different Phase or Transmittance

In one embodiment of the defect analysis tool, the user can analyze how a defect may change by assigning different phase and transmission values to an area of the defect image. To access this function, the user can click on Selection in the menu bar and then Phase in the associated pull-down menu. At this point, the user can enter a phase manually (e.g. from 00 to 3590).

ADSS Output Information

After the defect analysis tool performs an ADSS calculation, page 900 could display the ADSS settings (i.e. CD, thresholds, and tolerance settings) and job results. Exemplary job results could include the following values. The Number of Detected Defects can specify the number of defects found. The DSS can specify the defect severity score (DSS) for the ADSS job. Note that this value can be calculated at the different defocus values and exposure levels. A DSS range from 0 to 10 could be color-coded. For example, a green defect in a simulated image could mean a defect in the 0 to 3 range, a yellow defect could mean a defect in the 3 to 6 range, and a red defect could mean a defect in the 6 to 10 range.

A Maximum DSS value can specify the largest possible DSS value or the largest DSS value resulting from all the defects from the ADSS job. An Average DSS can specify the average DSS value for all the ADSS jobs calculated for this defect. An Alignment Point On Defect can specify the (X, Y) alignment area on the defect image that was used in the ADSS job. An Alignment Point On Reference can specify the (X, Y) alignment area on the reference image that was used in the ADSS job.

A Feature Used For X Alignment On Reference value can specify the alignment area (in the X-direction) on the reference image that was used in the ADSS job. A Feature Used For Y Alignment On Reference can specify the alignment area (in the Y-direction) on the reference image that was used in the ADSS job. A Feature used for X alignment on defect: specifies the alignment area (in the X-direction) on the defect image that was used in the ADSS job. A Feature Used For Y Alignment On Defect can specify the alignment area (in the Y-direction) on the defect image that was used in the ADSS job.

Image Threshold values can indicate the threshold values used in the ADSS job. A Nominal Threshold can indicate the average threshold value used in the ADSS job. These values may appear only if the user has manually set one or more thresholds. A Width Change Limit can indicate the tolerance value used in the ADSS job. In one embodiment, the tolerance appears only if the user has requested an automatic threshold.

Generating a Report

A user can create a report including the job results. In page 900, the user can click on the Report button. The saved report can then be mailed to appropriate individuals for additional analysis. When all selected defects have been reviewed and desired reports for those defects have been generated, the user can return to the Level 2 review page by clicking on the Done button. At the Level 2 review page, the user can select another set of defects, if desired. When all mask defects have been reviewed, the user can click the Review Completed button.

File Conversion Tool

Mask manufacturers can use mask images in different formats. Therefore, in accordance with one feature of the invention, before a mask image can be loaded into the defect analysis tool database, the mask image must first be converted to a standard mask file format using a file conversion tool. After the file conversion tool saves the inspection system settings and mask settings, it can output a ZIP file containing a standard mask file format file (*.mff format) that contains all the required information about the mask image.

Figure 10:
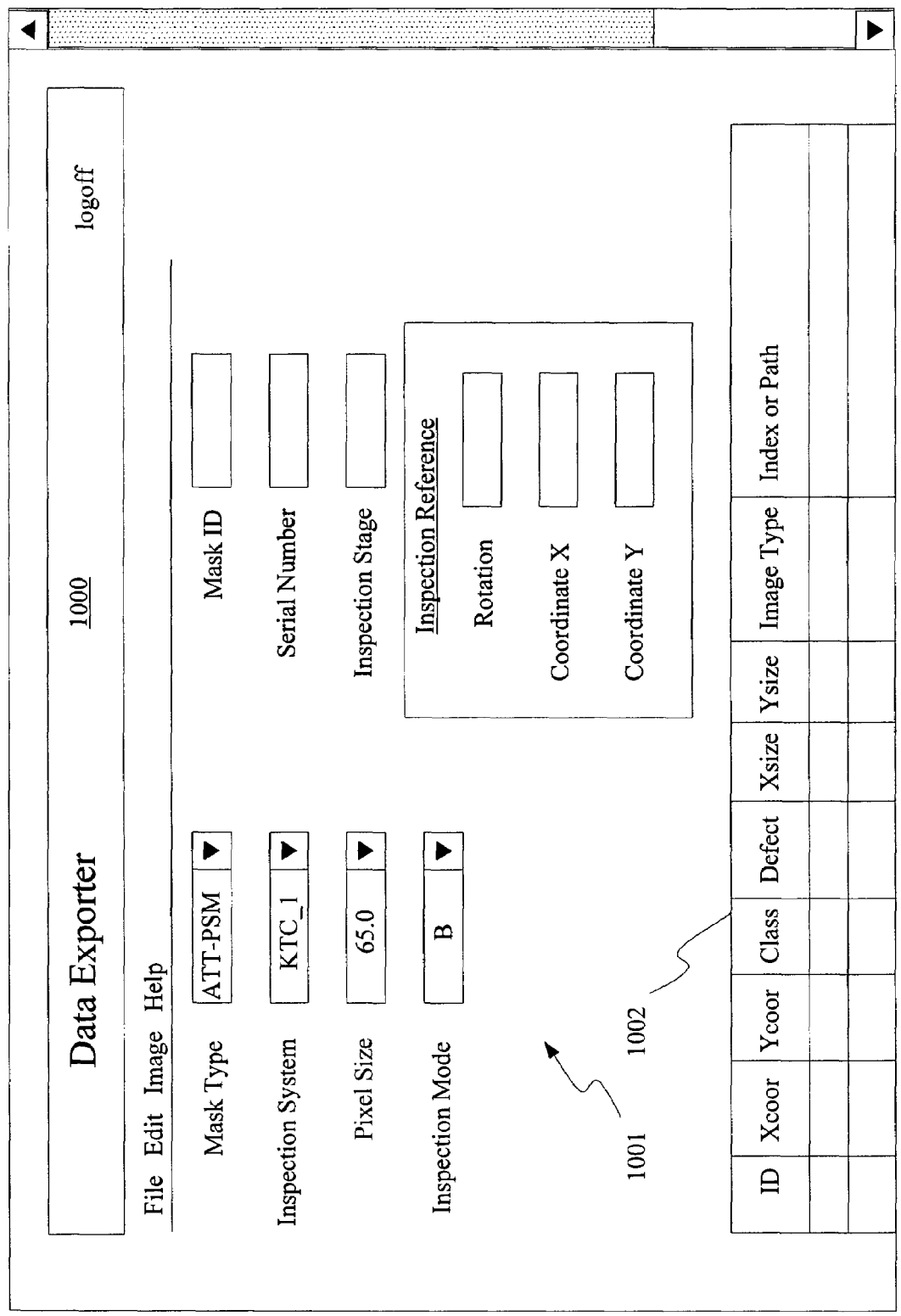
FIG. 10 illustrates an exemplary file conversion tool page that can facilitate converting a non-standard mask file into a standard mask format file (MFF).

FIG. 10 illustrates an exemplary file conversion tool page 1000. On page 1000, a settings region 1001 specifies the technology settings for the inspection system, mask type, and other information, whereas a defects table 1002 lists the defects of an exported mask in a user-defined order. In this embodiment, settings region 1001 can include pull-down menus that allow a user to specify a Mask Type (e.g. attenuated PSM (A-PSM) and binary), an Inspection System (i.e. the name of the inspection system available in the defect analysis tool database), the Pixel Size, and an Inspection Mode (i.e. the inspection mode based on the inspection system model).

Settings region 1001 can further include text boxes for a user to input a Mask ID (a user given identification for the mask), a Serial Number (a user-defined serial number for the mask), an Inspection Stage (e.g. post repair, pre-repair, etc.), an Inspection Reference (i.e. an inspection scan offset value defined by rotation, x coordinate, and y coordinate).

The File menu in the menu bar allows a user to create a new MFF file from a vendor's specific mask file format (*.bmp, *.ubc, *.ras, etc.), load an existing mask (*.mff file), save a mask image to a *.mff for import using the defect analysis tool, save a mask image as another file, open a file browser to select a KLA RF formatted mask image (*.rff file), or close the File conversion tool.

The Edit menu (via a Preferences heading) allows a user to input the path and file name for the location of the user's MIF file, the path to the directory where ZIP files containing an MFF file will be saved, the path to the directory from where KLARF files will be imported, and the path to the directory from where other image files will be imported. In one embodiment, the user can indicate that the above-described settings should be saved for the next time the File conversion tool is started. In one embodiment, the user can create default settings and/or restore default settings.

The Edit menu (via a Filter heading) allows the file conversion tool to recognize file types other than KLA RF and automatically assigns image files to their corresponding type and defect ID when many images are loaded at once. In one embodiment, each image type can have an associated filter or file pattern. For example, an AIMS file filter can be expressed as ${id}aims.* which is the id number ($fid), underscore ( ), aims, with an extension of a wildcard (*) to match any character. The user can edit the filter by selecting the filter in a table and editing the file pattern in a text box.

The Image menu allows a user to open a mask information dialog. This dialog displays the mask defect images. In one embodiment, the image can include a defect number, X and Y coordinates, and the illumination values (e.g. 0 and 255) based on the cursor location on the image. In one embodiment, the user can move a cursor on the selected image to check the minimum dark and maximum bright background. The user can set the illumination values with text boxes for setting the minimum dark background and the maximum bright background. If user does not set these illumination values, then the defect analysis tool can automatically calculate the values. In yet another embodiment, the image menu also can allow a user to import an image file other than KLA RF.

The Help menu provides information on the defect analysis tool as well as file conversion tool. Note that various functions described in reference to the file conversion tool menus can be implemented using icons.

Defects table 1002 can include the defects on the mask. In one embodiment, these defects can be listed by order of the selected heading. By default, the list can be sorted by defect ID. In one embodiment, the user can manually add defects to or change defect information in defects table 1002.

Exemplary table headings can include the defect ID from the KLA RF file (or system generated ID if non-KLA RF), the X coordinate of the defect listed, the Y coordinate of the defect listed, the KLA RF defect class, the Defect Type (e.g. Defect, Soft Defect, or Repaired), the X size (nm), the Y size (nm), the default defect image type and the index number for the KLA RF file or the path to another image file.

To receive a KLA RF Mask, a user can select Import KLA RF from the File menu. At this point, the user can enter information regarding the Mask Type, Inspection System, Pixel Size, Inspection Mode, Mask ID, Serial Number, Inspection Stage, and Inspection Reference. After selecting the desired file for importing, the user can review the contents of a Defects table and edit information therein as appropriate, thereby allowing a user to supplement information missing from a KLA RF file. To save this MFF file, the user can select Save from the File menu, browse to the directory in which the file will be saved, enter a file name, and click a button Save. At this point, the saved file can be used by the defect analysis tool.

To receive (i.e. import) a non-KLA RF mask, a user can enter information regarding the Mask Type, Inspection System, Pixel Size, Inspection Mode, Mask Id., Serial Number, Inspection Stage, and Inspection Reference. At this point, the user can select Import from the Image menu, thereby opening an image file browser. After selecting the desired file for importing, the user can review the contents of the Defects table and edit information therein as appropriate. To convert this non-MFF file into an MFF file and save the resulting MFF file, the user can select Save from the File menu, browse to the directory in which the file will be saved, enter a file name, and click a button Save. At this point, the saved file can be used by the defect analysis tool.

In accordance with one embodiment of the invention, the defect analysis tool with job-based automation can be implemented using the Virtual Stepper® system, licensed by Numerical Technologies, Inc., to provide defect review, printability analysis, and mask status. In another embodiment, the file conversion tool can be implemented using the Data Exporter tool, also licensed by Numerical Technologies, Inc., to convert a mask image file into a format readable by the defect analysis tool. These tools can be advantageously integrated to form a complete workflow. In one embodiment, the defect analysis tool and the file conversion tool can be run on a Windows 2000® or a Unix platform.

In accordance with one feature of the invention, the parameters set in the Mask Setting screen or the Stepper Setting screen can be exported with security features. For example, in one embodiment, a user in a fabrication facility may want information regarding its steppers to be kept as a trade secret. In this case, the user can click on Security in the main menu bar to pull up a window. This window can include an Export button that when clicked allows the user to encrypt information regarding the parameters. In one embodiment, all information except for the Name can be encrypted. Then, the user in the fabrication facility can send the encrypted stepper files to a mask house user, wherein the mask house user can import those files into a defect analysis tool. At this point, the mask house user can run ADSS or simulation jobs using the encrypted stepper settings even without having direct access to the actual stepper parameters used at the fabrication facility.

Although illustrative embodiments of the invention have been described in detail herein with reference to the figures, it is to be understood that the invention is not limited to those precise embodiments. They are not intended to be exhaustive or to limit the invention to the precise forms disclosed. As such, many modifications and variations will be apparent. For example, in accordance with other embodiments of the invention, both a system and a computer program product can be provided for implementing the above-described defect analysis functionality.

Note that the system and methods described herein can be applied to any lithographic process technology, including ultraviolet, deep ultraviolet (DUV), extreme ultraviolet (EUV), x-ray, and ebeam. Accordingly, it is intended that the scope of the invention be defined by the following claims and their equivalents.

The invention claimed is:

1. A method of analyzing a mask for use in photolithography, the method comprising:
    loading a mask file into a defect analysis tool;
    specifying a job to be run using the mask file, wherein the job defines parameters used in processes performed uniformly for defects on the mask, the parameters including settings relating to the mask, an inspection system that provided information for the mask file, and a stepper that can be used in exposing the mask during photolithography;
    managing and distributing the job to computation resources;
    running the job using the mask file and defined parameters on the computation resources; and
    outputting results of the job from the computation resources, wherein the results include printability results for the defects on the mask.

2. The method of claim 1, wherein the mask file includes a standard mask format file (MFF).

3. The method of claim 2, further including converting mask data into the standard MFF.

4. The method of claim 1, wherein the settings include at least one of mask type, phase of the mask, and transmission of the mask.

5. The method of claim 1, wherein the settings include at least one of an inspection system vendor and an inspection system model.

6. The method of claim 1, wherein the settings include at least one of wavelength, numerical aperture, reduction, defocus, and illumination.

7. The method of claim 1, wherein managing and distributing the job is performed by a job manager.

8. The method of claim 7, wherein the job manager allows multiple jobs to be run in parallel.

9. The method of claim 7, wherein the job manager schedules multiple computation resources to run one or more jobs.

10. The method of claim 1, wherein the results include multiple levels for user review.

11. The method of claim 10, wherein one level includes an overall summary of simulations performed on the defects.

12. The method of claim 11, wherein the overall summary includes defect scoring of the defects.

13. The method of claim 10, wherein one level includes a defect map of the defects on the mask.

14. The method of claim 13, wherein the defect map is color-coded based on a defect severity associated with each defect.

15. The method of claim 14, wherein a high defect severity is indicated by a flashing light.

16. The method of claim 10, wherein one level can provide an aerial image of each defect and a reference image of an area corresponding to that of the defect.

17. The method of claim 1, further comprising:
entering a status for each defect based on a user's review of the results of the job.

18. The method of claim 17, further comprising:
providing a history of statuses for each defect based on users' reviews of the results of the job.

19. The method of claim 1, further comprising:
accessing the results of the job using a web browser.

20. A system for analyzing a mask for use in photolithography, the system comprising:
an application server for running a defect analysis tool;
means for loading a mask file into the defect analysis tool;
means for specifying a job to be run using the mask file, wherein the job defines parameters used in processes performed uniformly for defects on the mask, the parameters including settings relating to the mask, an inspection system that provided information for the mask file, and a stepper that can be used in exposing the mask during photolithography;
computation resources for running the job;
a job manager for distributing the job to the computation resources and receiving results of the job from the computation resources; and
means for outputting results of the job, wherein the results include printability results for the defects on the mask.

21. The system of claim 20, further including means for converting mask data into a standard mask format file (MFF).

22. The system of claim 20, wherein the settings include at least one of mask type, phase of the mask, and transmission of the mask.

23. The system of claim 20, wherein the settings include at least one of an inspection system vendor and an inspection system model.

24. The system of claim 20, wherein the settings include at least one of wavelength, numerical aperture, reduction, defocus, and illumination.

25. The system of claim 20, further including storage for storing at least one of the parameters and the results of the job.

26. The system of claim 20, wherein the job manager includes means for allowing multiple jobs to be run in parallel.

27. The system of claim 26, wherein the job manager includes means for scheduling multiple computation resources to run one or more jobs.

28. The system of claim 20, wherein the means for outputting results includes means for accessing the results via multiple review levels.

29. The system of claim 28, wherein at least one review level includes an overall summary of simulations performed on the defects.

30. The system of claim 29, wherein at least one review level includes a defect map of the defects on the mask.

31. The system of claim 30, wherein the means for outputting includes means for color-coding the defect map based on a defect severity associated with each defect.

32. The system of claim 31, wherein the means for color-coding the defect map includes means for providing a flashing colored light for any defect having a high defect severity.

33. The system of claim 32, wherein at least one review level can provide aerial images of each defect and a corresponding reference image of that defect.

34. The system of claim 20, further comprising at least one of:
means for entering a status for each defect based on a user's review of the results of the job; and
means for providing a history of statuses for each defect based on users' reviews of the results of the job.

35. The system of claim 20, wherein the means for outputting provides a graphic user interface.

36. The system of claim 35, wherein the means for outputting interfaces with a web browser to provide the graphic user interface.

37. A computer program product comprising:
a computer usable medium having a computer readable program code embodied there for causing a computer to analyze defects of a mask used in photolithography, the computer readable program code comprising:
code that loads a mask file into a defect analysis tool;
code that specifies a job to be run using the mask file, wherein the job defines parameters used in processes performed uniformly for defects on the mask, the parameters including settings relating to the mask, an inspection system that provided information for the mask file, and a stepper that can be used in exposing the mask during photolithography;
code that manages and distributes the job to computation resources;
code that runs the job using the mask file and defined parameters on the computation resources; and
code that outputs results of the job, wherein the results include printability results for the defects on the mask.

38. The computer program product of claim 37, further including code that converts mask data into a standard mask format file (MFF).

39. The computer program product of claim 37, wherein the code that manages and distributes the job includes a job manager.

40. The computer program product of claim 39, wherein the job manager allows multiple jobs to be run in parallel.

41. The computer program product of claim 37, wherein the code that outputs results includes code for providing multiple review levels for a user.

42. The computer program product of claim 37, further comprising at least one of:
code that enters a status for each defect based on a user's review of the results of the job; and
code that provides a history of statuses for each defect based on users' reviews of the results of the job.

* * * * *